(12) United States Patent
Nakashiba

(10) Patent No.: US 7,030,918 B1
(45) Date of Patent: Apr. 18, 2006

(54) SOLID-STATE IMAGE PICKUP DEVICE

(75) Inventor: Yasutaka Nakashiba, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 815 days.

(21) Appl. No.: 09/603,927

(22) Filed: Jun. 27, 2000

(30) Foreign Application Priority Data

Jun. 30, 1999 (JP) .................... 11-186709

(51) Int. Cl.
H04N 3/14 (2006.01)
H01L 27/00 (2006.01)
H01L 31/112 (2006.01)
H01L 31/113 (2006.01)
H04N 5/228 (2006.01)

(52) U.S. Cl. .............. 348/294; 250/208.1; 257/278; 257/294

(58) Field of Classification Search ........ 348/294–324; 250/208.1; 257/257, 278, 294
See application file for complete search history.

(56) References Cited

U.S. PATENT DOCUMENTS

| 4,841,348 A | * | 6/1989 | Shizukuishi et al. ....... 257/435 |
| 5,514,888 A | * | 5/1996 | Sano et al. ................ 257/232 |
| 5,847,381 A | * | 12/1998 | Isogai ..................... 250/208.1 |
| 6,043,115 A | * | 3/2000 | Pan ....................... 257/E21.641 |
| 6,051,857 A | * | 4/2000 | Miida ......................... 257/292 |
| 6,150,676 A | * | 11/2000 | Sasaki ......................... 257/446 |
| 6,172,351 B1 | * | 1/2001 | Kimura ..................... 250/208.1 |
| 6,403,998 B1 | * | 6/2002 | Inoue ......................... 257/292 |
| 6,498,622 B1 | * | 12/2002 | Nakashiba ................. 348/308 |
| 6,618,087 B1 | * | 9/2003 | Hokari et al. .............. 348/311 |

FOREIGN PATENT DOCUMENTS

| JP | 63-318154 | | 12/1988 |
| JP | 3-44071 | | 2/1991 |
| JP | 5-110045 | | 4/1993 |
| JP | 7-94694 | | 4/1995 |
| JP | 9-331053 | | 12/1997 |
| JP | 11-097662 | * | 4/1999 |
| JP | 11-97662 | | 4/1999 |

* cited by examiner

Primary Examiner—David Ometz
Assistant Examiner—Nhan Tran
(74) Attorney, Agent, or Firm—Young & Thompson

(57) ABSTRACT

The present invention discloses a solid-state image pickup device in which a photoelectric conversion part having a photoelectric conversion region, and a logic circuit part are formed on a semiconductor substrate, and outputs a potential change caused by the charges generated in the photoelectric conversion region, and is provided with a light shielding layer that covers the logic circuit part, and a light shielding film that defines the region of beam incidence on the photoelectric conversion region, where the light shielding film is provided closer to the semiconductor substrate than the light shielding layer.

25 Claims, 15 Drawing Sheets

SOLID-STATE IMAGE PICKUP DEVICE

BACKGROUND OF THE INVENTION

1. Field of the Invention

The present invention relates to a solid-state image pickup device, and more particularly to a technology adapted to an active XY address type solid-state image pickup device among solid-state image pickup devices compatible with the CMOS manufacturing processes (the so-called CMOS sensors) or to a CCD sensor.

2. Description of the Prior Art

The conventional solid-state image pickup devices of the transfer layer type that transfer photoelectrically converted signal charges can roughly be classified into those of MOS type and CCD type. These solid-state image pickup devices, especially the solid-state image pickup devices of the CCD type, have been applied in recent years to camera-integrated VTRs, digital cameras, facsimile equipment, and the like, and are still in the process of technical development for improvement of their characteristics.

A CCD sensor is equipped with a photoelectric conversion part in which photoelectric conversion elements corresponding to pixels are arranged two-dimensionally, and pixel signals that are converted to electrical charges by means of the photoelectric conversion part are read sequentially by a vertical transfer CCD and a horizontal transfer CCD.

A CMOS sensor does not employ CCDs for vertical and horizontal transfers, and reads pixels selected by selection lines formed of aluminum wires or the like, as in the case of a memory device.

Here, in comparison to the CCD sensor that requires a plurality of positive and negative power supply potentials, the CMOS sensor can be driven by a single power supply, and hence it is possible to reduce the power consumption and the operating voltage as compared with the CCD sensor.

Moreover, in contrast to the difficulty for the CCD sensor that adopts intrinsic manufacturing processes in applying the manufacturing processes, as they are, of the CMOS circuit, the manufacturing processes of CMOS circuits are readily adopted for the CMOS sensor. Accordingly, in the CMOS sensor it is possible to form simultaneously a logic circuit, an analog circuit, an analog to digital conversion circuit, and the like by the CMOS processes that are widely in use for the manufacture of a processor, a semiconductor memory such as DRAM, a logic circuit, or the like. In short, the CMOS sensor can be formed on the same semiconductor chip along with a semiconductor memory and a processor, or can share the same production line with a semiconductor memory or a processor. An example of the CMOS sensor is shown in FIG. 12.

In FIG. 12 which shows an image-pickup element (CMOS sensor) labeled with symbol 100, the CMOS sensor 100 comprises a timing generating part 102, an image sensor part 101, a vertical scanning part 103 and a horizontal scanning part 104 for selecting pixel outputs, an analog signal processing part 105, an A/D part (A/D conversion part) 109 for performing analog to digital conversion, a digital signal processing part 107 for converting a digitized signal into an output signal, and an interface part (IF part) 108 for outputting digital image data to the outside as well as receiving a command from the outside.

The image sensor part 101 is an assembly of fundamental cells of the CMOS sensor as will be described later, and the vertical scanning part 103 is for vertically controlling the fundamental cells of the image sensor part 101, the horizontal scanning part 104 is for horizontally controlling the fundamental cells of the image sensor part 101, and these scanning parts perform respective scanning control by means of timing signals output from the timing generating part 102.

The analog signal processing part 105 applies a required processing to an image signal read from the image sensor part 101 to output the result to the A/D conversion part 109, the A/D conversion part 109 converts the image signal into a digital signal to output the result to the digital signal processing part 107, and the digital signal processing part 107 outputs the image signal to the IF part 108.

The IF part 108 outputs digital image data output via the digital signal processing part 107, and is capable of inputting a command from the outside. With this arrangement, the IF part 108 controls various constituent components so as to be able to control the mode, output signal form, signal output timing or the like of the image-pickup element 100 in response to the command.

Here, the vertical scanning part 103, the horizontal scanning part 104, the A/D conversion part 109, the digital signal processing part 107, the IF part 108, and the like constitute a logic circuit part 106. Moreover, a configuration may be adopted in which the digital signal processing part 107 is provided with a memory for storing one or plural lines, one or plural blocks, or one or plural frames of image data to be utilized for signal processing in the digital signal processing part 107.

Next, a part of the conventional fundamental cells in the image sensor part 101 and the logic circuit part 106, of the CMOS sensor 100 will be shown in FIG. 13.

In FIG. 13, symbol 10 is the CMOS sensor being the fundamental cells, 11 is a P type silicon substrate, 12 is a P type well, 13 is a field oxide film for element isolation, 14 is an N type region (photoelectric conversion region) which is to be a photodiode, 15 is an $N^+$ type region (diffused layer) which is to be a reset drain, 16, 16A, and 16B are gate SiO2 films. Moreover, symbol 17 is a polycrystalline silicon film which is to be a reset gate, 17A is the gate film of a MOSFET of a source follower amplifier, 17B is the gate film of a MOSFET as a horizontal selection switch, 15A is an $N^+$ type region which is to be the source or drain of the MOSFET of the source follower amplifier, 15B is an $N^+$ type region which is to be the source or drain of the MOSFET of the source follower amplifier as well as the source or drain of the MOSFET as the horizontal selection switch, 15C is a P type region which is to be the source or drain of a load MOSFET, 18A, 18B, 18C, 19A, and 19B are wiring layers, and 21 is a metal film which is to be a light shielding film that defines an opening part through which light is made incident.

In the CMOS sensor 10, the photoelectric conversion region 14 is connected to the gate 17A of the MOSFET constituting the source follower amplifier via the wiring layer 18B or the like, by which the $N^+$ type region 15A which is to be the source or drain of the MOSFET is linked to the source or drain of the MOSFET as the horizontal selection switch so that these MOSFETs are connected. Consequently, the $N^+$ type region 15B which is to be the source or drain of the MOSFET is linked and connected to the source or drain of the load MOSFET forming the source follower amplifier. The $N^+$ type region 15B which is to be the source or drain of both MOSFETs is connected to the source or drain of a dark output transfer MOSFET and a bright output transfer MOSFET, respectively, and the sources or drains of the dark output transfer MOSFET and the bright output transfer MOSFET are connected to a dark output storage capacitor and a bright output storage capacitor, respectively.

Between the photoelectric conversion region 14 and the light shielding film 21 there are provided a layer insulating film 22 and a plurality of wiring layers 16, 16A, 16B, 17, 17A, 17B, 18A, 18B, 18C, 19A, 19B, and 19C, as shown in FIG. 13.

The logic circuit part 106 is formed adjacent to, for example, the image sensor part 101 as shown in FIG. 13. In the part 106, a P type well 32A and an N type well 32B are formed in the P type silicon substrate 11, an $N^+$ type region 33A and a $P^+$ type region 33B that are to be diffused layers are provided in the well regions 32A and 32B, respectively, gates 34A and 34B formed of polycrystalline silicon are provided above these regions, metal films 35A, 35B, 36A, and 36B that are to be wiring layers are provided above the gates, and a light shielding layer 20 covering all of these is provided in the topmost part.

The CMOS sensor 10 with the above configuration operates as in the following.

First, as shown in FIG. 14A, the potential of the photoelectric conversion region 14 is set at a power supply voltage VDD by applying a high pulse ØR to the reset gate 17 to reset the signal charge of the photoelectric conversion region 14. Next, a low pulse ØR is applied to the reset gate 17 for preventing blooming as shown in FIG. 14C.

During storage of signal charges, when electron-hole pairs are generated in the region below the photoelectric conversion region 14 by light whose incident position is regulated by the opening part 23 of the light shielding film 21, electrons are stored in a depletion layer below the photoelectric conversion region 14, and holes are discharged through the P type well 12. In FIG. 14C, the region with deeper potential than the power supply voltage VDD indicated by crisscrossed hatching shows that the region is not depleted. Since a potential barrier is formed between the depletion layer formed in the P type well 12 below the photoelectric conversion region 14 and the $N^+$ type region 15 which is to be a floating diffused layer by a control MOSFET, electrons remain in the region below the photoelectric conversion region 14 during storage of the photoelectric charges as shown in FIG. 14C.

Following that, the potential of the photoelectric conversion region 14 varies corresponding to the number of stored electrons, the change in the potential is output to the drain ($N^+$ type region) 15B of the horizontal selection switch MOSFET via the source ($N^+$ type region) of the source follower amplifier MOSFET by means of the operation as a source follower, and the potential is output from the wiring layer 19B which acts as the output terminal of the source follower amplifier. In this way, it is possible to obtain a photoelectric conversion characteristic of an excellent linearity.

Here, kTC noise due to reset is generated in the $N^+$ type region 15 which is to become a floating diffused layer. However, the noise can be removed by taking the difference between the bright output, and the dark output that has been accumulated prior to the signal electron transfer.

In recent years, design of a semiconductor device as a "system on chip (SOC)" that includes desired system/element functional operations in a single LSI body by unifying various pieces of hardware (H/W integration) such as a CPU, memory, standard/dedicated macro, analog circuit, and image sensor part, and various pieces of software (S/W integration) such as image compression and expansion, sound processing, and communication functions, has been tried. In order to manufacture a solid-state image pickup device as an SOC, the logic circuit part 106 is manufactured utilizing technologies accumulated in the past, and adaptation of a hybrid technology that integrates different processes on a single chip to form the solid-state image pickup device has been in demanded.

Here, there has been a demand to obtain the CMOS sensor as an SOC by forming an image sensor part 101 simultaneous with the logic circuit part 106 through utilization of CMOS processes by standard parameters that are widely in use in the formation of processors, semiconductor memories such as DRAM, logic circuits, or the like. There has been a demand to share the production line with semiconductor memories, processors or the like by forming these components on one chip in a single process flow.

In accordance with such demands, in the logic circuit part 106, the light shielding layer 20 is provided at the highest position of each element. In other words, a metal layer which is to become the light shielding layer 20 is formed above the wiring layers 35A, 35B, 36A, and 36B in order to effect light shielding without changing the arrangement of the wiring layers 35A, 35B, 36A, and 36B that are given the existing structure.

In the structure of the CMOS sensor 10 in the above, the light shielding layer 20 and the light shielding film 21 are provided at the topmost position as an integrated body. Since the layer insulating film 22 and a plurality of wiring layers 16, 16A, 16B, 17, 17A, 17B, 18A, 18B, 18C, 19A, 19B, and 19C exist between the light shielding film 21 that regulates the opening part 23 and the photoelectric conversion region 14 above the silicon substrate 11, the spacing L0 between the light shielding film 21 and the photoelectric region 14 becomes several μm which is very large in comparison to the wavelength (in the range of 350 to 770 nm) of the visible rays. As a result, incident beams 25 diffracted by the diffraction effect of the beams incident through the opening part 23 are made incident on the periphery of the photoelectric conversion region 14 as shown in FIG. 15.

Consequently, according to such a structure of the CMOS sensor, false signals generated by the photoelectric conversion effect of the light incident on the periphery of the photoelectric conversion region 14 leaks into adjacent photoelectric conversion region, and causes the problem of degradation of the S/N of image signals.

As counter measures against the false signals there has been proposed such a technology as to set the dimension (for example, the width W0) of the opening part 23 to be smaller compared with the dimension (for example, the width W14) of the photoelectric conversion region 14. However, in such a case, the quantity of light incident on the photoelectric conversion region 14 is reduced, and results in the problem of the reduction in the sensitivity.

Furthermore, when a means is adopted to provide, for example, the light shielding film 21 at a position below the wiring layers 18A, 18B, 18C, 19A, 19B, and 19C as countermeasures against the false signals, and as a solution to the reduction in the quantity of light on the photoelectric conversion region 14 and to the reduction in the sensitivity, it becomes necessary also in the logic circuit part 106 to place the light shielding layer 20 below the positions of the metal layers 35A, 35B, 36A, 36B, or the like because the light shielding layer 20 and the light shielding film 21 are formed integrally. This leads to the problem of the necessity for designing the logic circuit part 106 entirely anew.

Besides, in this case, there is a possibility in its manufacturing process of changing the existing parameters for manufacture and design, which results in the problem that the conversion to an SOC is difficult.

For these reasons, it may become impossible to exhibit the characteristics of the CMOS sensor such as, the simultaneous formation of a logic circuit, analog circuit, A/D conversion circuit, or the like, the formation of the image sensor part 101 on the same semiconductor chip as the semiconductor memory and the processor, and the possibility of sharing the production line with the semiconductor memory and the processor. As a result, there has been a possibility of being forced to adopt an intrinsic process for the CMOS sensor similar to the CCD sensor, and is unable to make active use of the characteristic of the CMOS sensor that the manufacturing cost is reducible.

BRIEF SUMMARY OF THE INVENTION

OBJECT OF THE INVENTION

It is an object of the present invention to reduce the false signals, to enhance the S/N of the image signals, as well as to realize the formation of an SOC.

SUMMARY OF THE INVENTION

The solid-state image pickup device according to the present invention is a solid-state image pickup device in which a photoelectric conversion part having a photoelectric conversion region and a logic circuit part (CMOS circuit part) are formed on a semiconductor substrate in the same process, and outputs a potential change caused by charges generated in the photoelectric conversion region. The device is provided with a light shielding layer covering the logic circuit part (CMOS circuit part) and a light shielding film which regulates the region of beam incidence on the photoelectric conversion region, where the light shielding film is provided at a position closer to the semiconductor substrate than the light shielding layer.

Here, it is preferable that at least a part of the light shielding film is located at an intermediate position between the light shielding layer and the photoelectric conversion region in direction of beam incidence.

The light shielding film covers the photoelectric conversion region, and it is provided in such a manner that the light shielding film and the light shielding layer have an overlapping parts that can be overlapped in the plan view, or are connected continuously so as to have continuous light shielding state.

It is preferable the light shielding layer is composed of a single layer or plural layers that have a sufficient light tightness with low light transparency or high light absorbency, and it may be formed of an organic material such as gelatin or casein, or it may be formed of a material with reduced light transparency or limited wavelength of transmitted light obtained by mixing a pigment or the like in a material having light transparency. In this case, the light shielding film may be made to have light transparency in the photoelectric conversion region, to form color filters corresponding to three primary colors of red, green, and blue (RGB) of color pixels, and has a sufficiently low light transparency to the extent to be able to prevent generation of the false signals in the other portions.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE INVENTION

Figure 1:
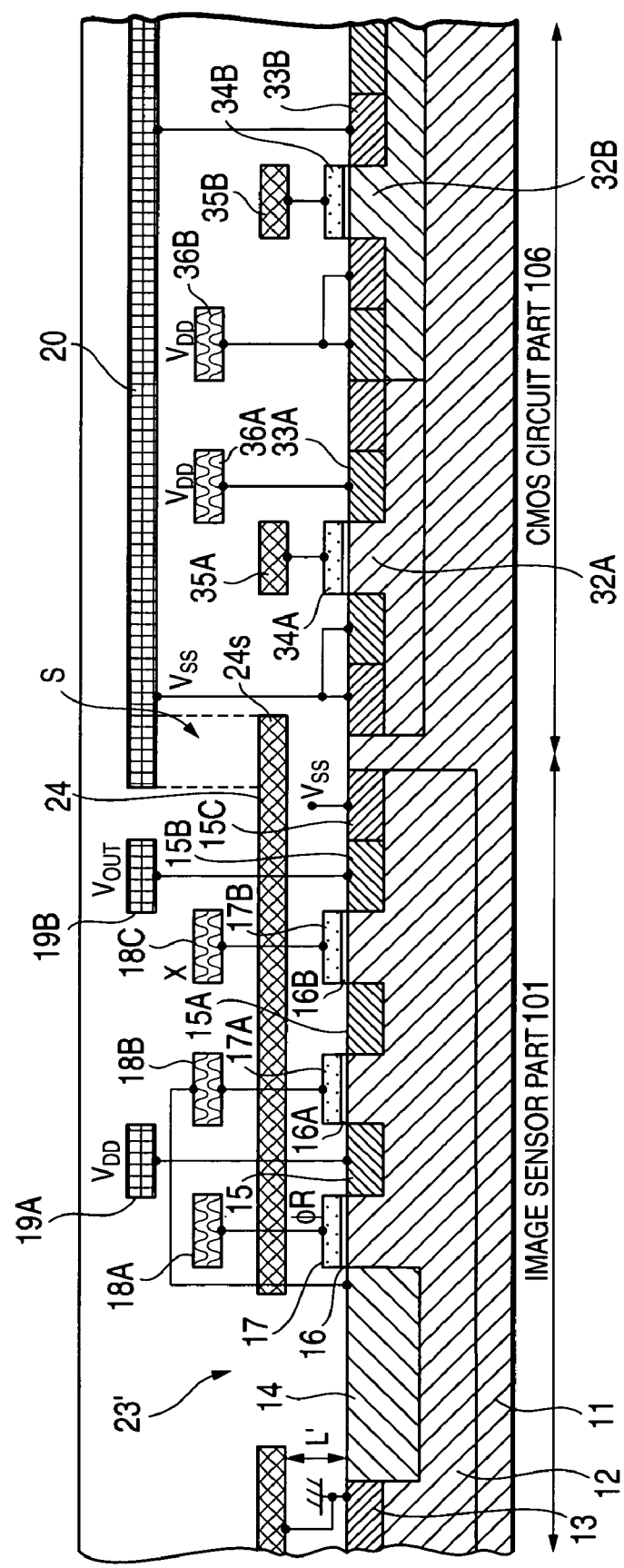
FIG. 1 is a side view of a first embodiment of the solid-state image pickup device according to the present invention.

Next, referring to the drawings, a first embodiment of the solid-state image pickup device according to this invention will be described.

Figure 2A:
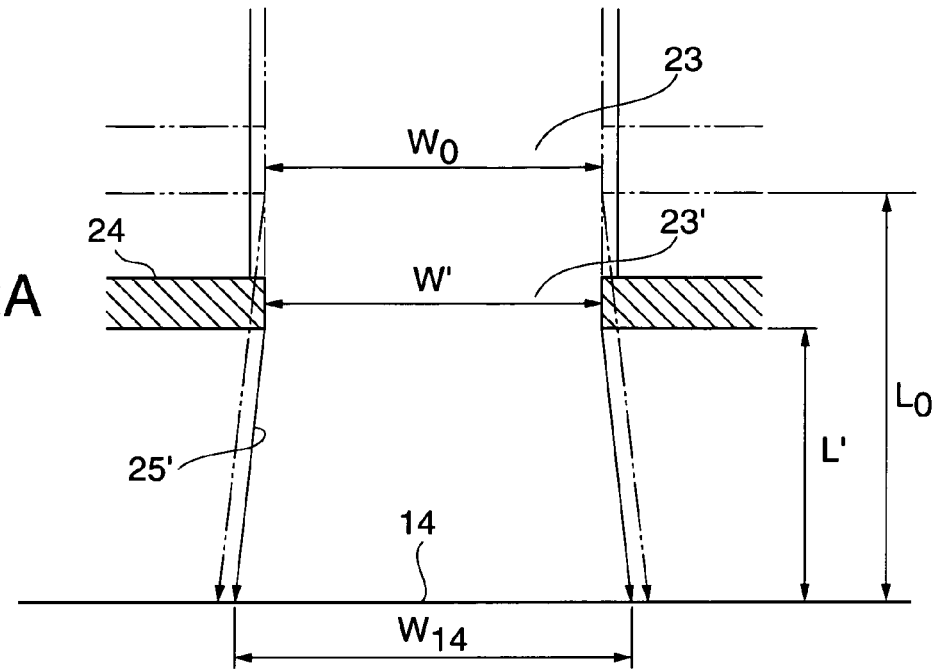
FIGS. 2A to 2B are a schematic enlarged side view showing the photoelectric conversion region and the light shielding film in FIG. 1.
Figure 2B:
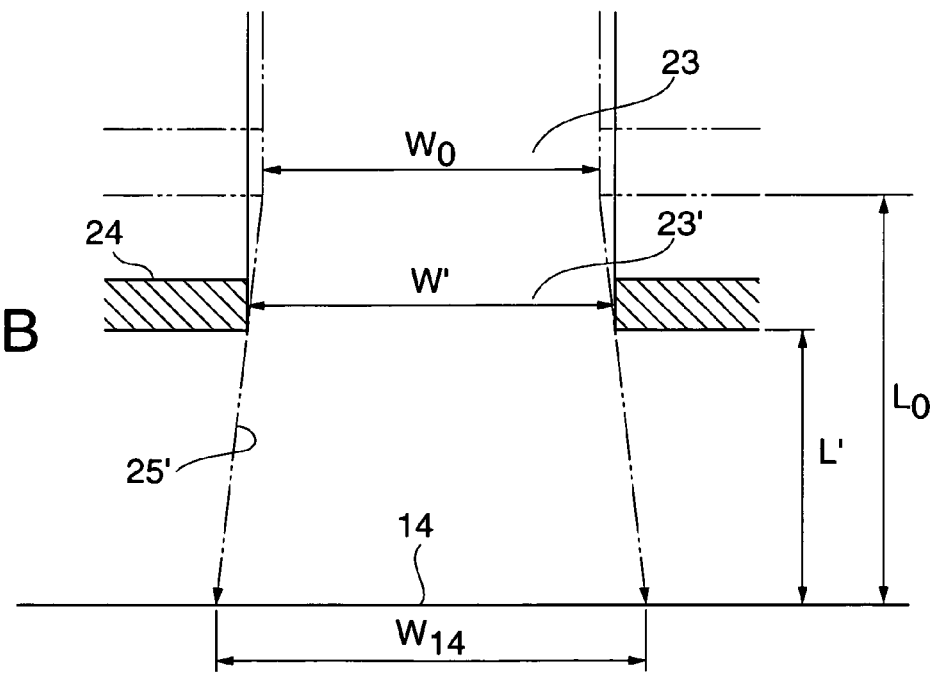

FIG. 1 is a schematic side view showing the solid-state image pickup device according to this embodiment, and FIGS. 2A and 2B are schematic enlarged side views showing the photoelectric conversion region and the light shielding film.

Figure 12:
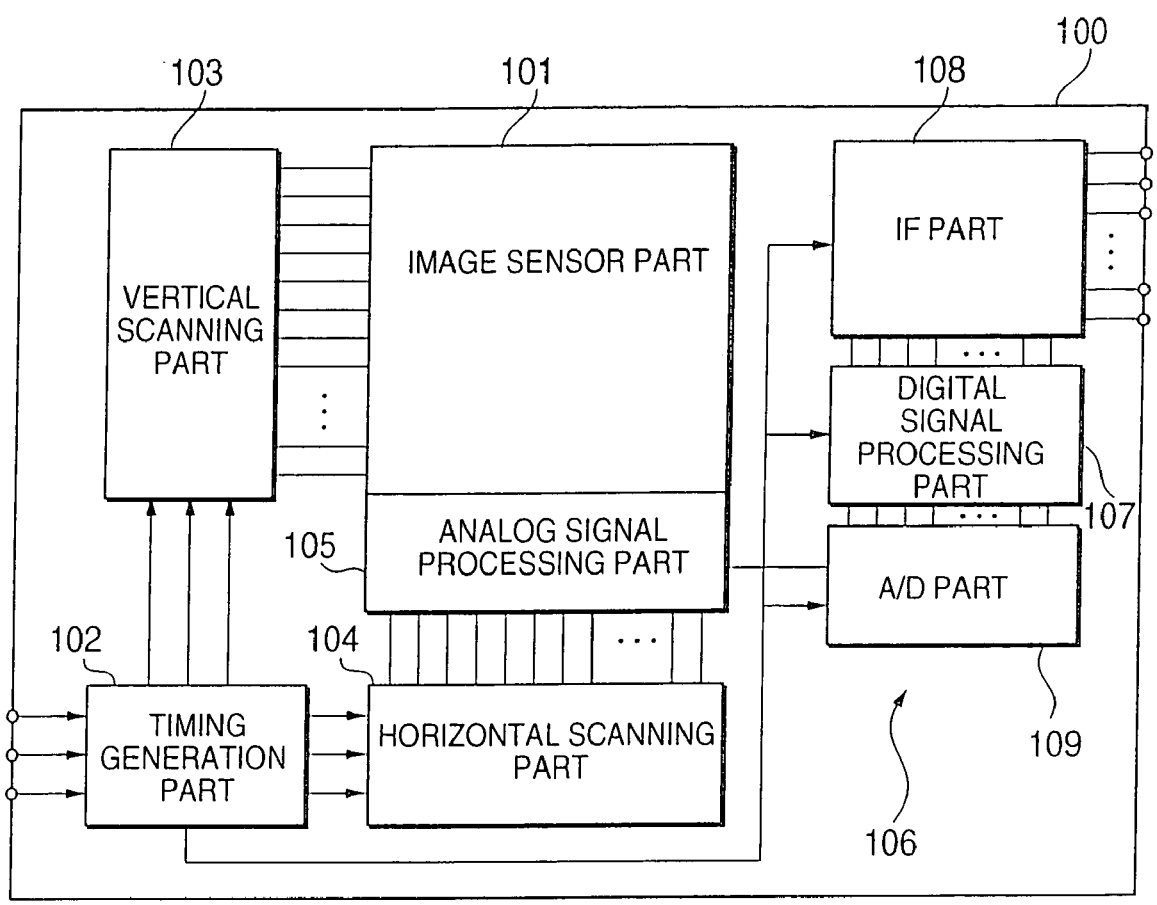
FIG. 12 is a plan view showing the arrangement of the image sensor part and the logic circuit part in the solid-state image pickup device.

The solid-state image pickup device in this embodiment is assumed to be an active XY address type CMOS sensor 100 similar to that as shown in FIG. 12.

Such a CMOS sensor 100 is provided with an image sensor part (photoelectric conversion part) 101 in which several hundreds several hundreds of fundamental cells are arranged to deal with the pixels, a timing generating part 102, a vertical scanning part 103 and a horizontal scanning part 104 for selecting pixel outputs, an analog signal processing part 105, an A/D part (A/D conversion part) 109 which performs analog to digital conversion of signals, a digital signal processing part 107 which converts a digitized signal into an output signal, and an interface part (IF part) 108 which outputs digital image data to the outside, and receives command data from the outside.

The image sensor part 101 is an assembly of the fundamental cells as will be described late. The vertical scanning part 103 and the horizontal scanning part 104 are for controlling the vertical scanning and horizontal scanning, respectively, of the fundamental cells of the image sensor part 101, and the respective controls of scanning are carried out by the timing signals output from the timing generating part 102.

The analog signal processing part 105 applies required signal processing to the image signal read from the image sensor part 101 to output the result to the A/D conversion part 109, the A/D conversion part 109 converts the image signal to a digital signal and outputs the result to the digital signal processing part 107, and the digital signal processing part 107 outputs the image signal to the IF part 108.

The IF part 108 outputs the digital image data output via the digital signal processing part 107 to the outside, and can receive a command from the outside. With this arrangement, the part 108 controls various constituent components so as to be able to control the mode, output signal form, signal output timing, or the like of the image pickup element corresponding to the command.

Here, the vertical scanning part 103, the horizontal scanning part 104, the A/D conversion part 109, the digital signal processing part 107, the IF part 108, or the like constitute a logic circuit part 106. Moreover, the digital signal processing part may be constituted such that it is provided with a memory part which is arranged to store image data corresponding to one or plural lines, one or plural blocks, or one or plural frames to be utilized for signal processing of the digital signal processing part 107. Besides, a configuration may also be adopted in which the timing generating part 102 is incorporated in the vertical scanning part 103, the horizontal scanning part 104, or the like.

In FIG. 1 or FIG. 2, symbol 10 is the CMOS sensor being the fundamental cells of the solid-state image pickup device in the embodiment. The CMOS sensor 10 is provided in the image sensor part 101 adjacent to the logic circuit part 106, as shown in FIG. 1.

The CMOS sensor 10 located in the image sensor part 101 is provided with a P type well 12 formed on a P type silicon substrate (semiconductor substrate) 11. On the P type well 12 there are provided an element isolation region 13 for isolating elements, an N type region (photoelectric conversion region) 14 which is to be a photodiode, an N$^+$ type region (diffused layer) 15 which is to be a reset drain, an N$^+$ type region 15A which is to be the drain of a MOSFET of a source follower amplifier to be described later, an N$^+$ type region which is to be the source or drain of the MOSFET of the source follower amplifier and the source or drain of a MOSFET of a horizontal selection switch, and a P type region 15C which is to be the source or drain of a load MOSFET.

Between and above the photoelectric conversion region 14 and the reset drain region 15, there is provided a reset gate 17 formed of polycrystalline silicon via a gate SiO2 film 16, between and above the reset drain region 15 and the N$^+$ type region 15A, there is formed the gate 17A of the MOSFET of the source follower amplifier via the gate SiO2 film 16A, and between and above the N$^+$ type region 15A and the N$^+$ type region 15B, there is formed the gate 17B of the MOSFET as the horizontal selection switch via the SiO2 film 16B.

The reset gate 17 the gate 17A, and the gate 17B are connected to the wiring layers 18A, 18B, and 18C, respectively, the reset drain region 15 is connected to the wiring layer 19A to which is applied a power supply voltage VDD, and the N$^+$ type region 15B is connected to the wiring layer 19B connected to an output terminal VOUT.

Here, the gate SiO2 films 16, 16A, and 16B are arranged at the same height of the surface of the photoelectric conversion region 14 on which the incident beams impinge.

Moreover, the reset gate 17, and the gates 17A and 17B are arranged at an equal distance above the position of the gate SiO2 films 16, 16A, and 16B that are formed on the same plane as that of the beam incidence on the photoelectric conversion region 14.

A light shielding film 24 that covers the image sensor part 101 is provided above the reset gate 17, and the gates 17A and 17B, the wiring layers 18A, 18B, and 18C are provided above the light shielding film 24 at the same height in the direction of beam incidence, and the wiring layers 19A and 19B are provided above the layers 18A, 18B, and 18C at the same height.

In the CMOS sensor 10, the photoelectric conversion region 14 is connected to the gate 17A of the MOSFET that constitutes the source follower amplifier through the wiring layer 18B or the like, and the N$^+$ type region 15A that is to be the source or drain of the MOSFET is linked and connected electrically to the source or drain of the MOSFET as the horizontal selection switch, and the N$^+$ type region 15B that is to be the source or drain of the MOSFET is linked and connected electrically to the source or drain of the load MOSFET forming the source follower amplifier. The N$^+$ type region 15B that is to be the source or drain of these MOSFETs is connected to the source or drain of a dark output transfer MOSFET and a bright output transfer MOSFET through the wiring 19B, and the source or drain of the dark output transfer MOSFET and the bright output transfer MOSFET is each connected to a dark output storage capacitor and a bright output storage capacitor.

The logic circuit part 106 is adjacent, for example, to the CMOS sensor 10 of the image sensor part 101 as shown in FIG. 1. In this portion, a P type well 32A and an N type well 32B are provided in the P type silicon substrate 11, an N$^+$ type region 33A and a P$^+$ type region 33B that are to be diffused layers are provided on the P type well 32A and the N type well 32B, respectively, gates 34A and 34B composed of polycrystalline silicon are provided above them through SiO2 film, metal films 35A, 35B, 36A, and 36B that are to be wiring layers are provided above them, and a light shielding layer 20 covering them is provided in the topmost part.

Here, the gates 34A and 34B are arranged at the same height which is equal to that of the reset gates 17, gates 17A and 17B, and larger than the distance of the gate SiO2 films 16, 16A, and 16B from the beam incident plane on the photoelectric conversion region 14.

Moreover, the wiring layers 35A and 35B are arranged at the same height with the same thickness as the light shielding layer 24, and the layers 35A and 35B and the film 24 constitute a first metal layer.

Furthermore, the wiring layers 36A and 36B are arranged at the same height and with the same thickness as the wiring layers 18A, 18B, and 18C, and the layers 36A and 36B, 18A, 18B, and 18C constitute a second metal layer.

The light shielding layer 20 is arranged at the same height as the wiring layers 19A and 19B, and the layers 20, 19A, and 19B constitute a third metal layer.

The light shielding film 24 formed of a metal such as aluminum has an opening part 23' above the photoelectric conversion region 14 and covers the image sensor part 101, and is placed at an intermediate position between the light shielding layer 20 and the photoelectric conversion region 14 in the beam incident direction, as shown in FIG. 1 and FIG. 2. The film 24 is placed at a position closer to the photoelectric conversion region 14 than the plurality of wiring layers 18A, 18B, 18C, 19A, 19B, and 19C so as to have the distance between the photoelectric conversion region 14 and the light shielding film 24 to be equal to L'.

The light shielding film 24 is positioned surrounding the entire periphery of the photoelectric conversion region 14 so as to define the region of beam incidence by shielding the incident light from the periphery of the photoelectric conversion region 14 by means of the opening part 23'. It also covers the image sensor part 101 to regulate the incidence of beams to the parts of the image sensor part other than the photoelectric conversion region 14.

Figure 15:
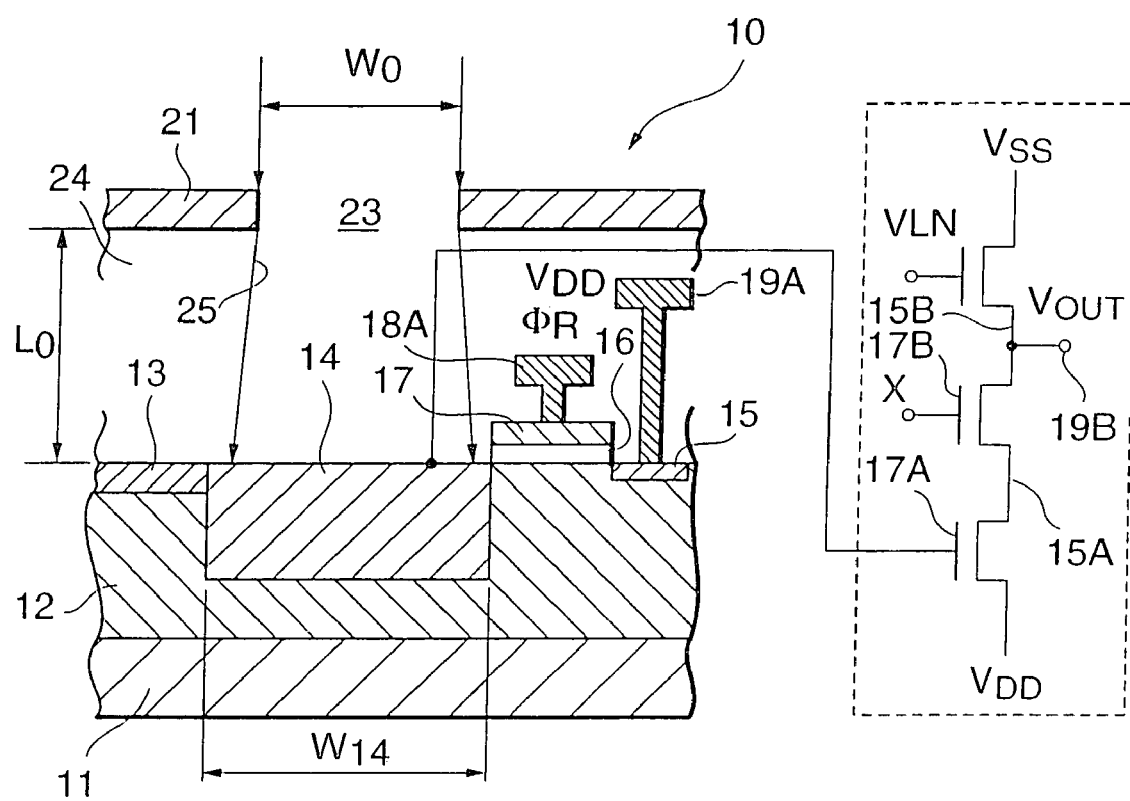
FIG. 15 is a schematic side view showing an example of the solid-state image pickup device.

Here, since the distance from the light shielding film 24 to the photoelectric conversion region 14 is set to L', and the distance L' is smaller than the distance L0 from the light shielding film 21 to the photoelectric conversion region 14 in FIG. 15, the dimension (for example the width W') of the opening part 23' can be set to satisfy the condition $$W0 \leq W' < W14$$

as shown in FIGS. 2B and 2C with respect to a dimension (for example, the width W0) of the opening part 23 of the light shielding film 21 and a dimension (for example, the width W14) of the photoelectric conversion region 14 as shown in FIG. 15.

The light shielding film 24 has an overlapping part 24s below the light shielding layer 20 so as to have an overlapping part S in the plan view in the boundary portion of the image sensor part 101 and the logic circuit part 106. In order to have sufficient light shielding property in the light shielding layer 20 and the overlapping @art 24s, there is given a prescribed dimension in the direction perpendicular to the direction of incidence of light. In other words, in order to warrant a satisfactory plan view overlap between the light shielding layer 20 and the overlapping part 24s, the image sensor part 101 and the logic circuit part 106 are provided in such a way that the light shielding state is continuous in their boundary portion.

The CMOS sensor 10 with such a configuration operates as in the following.

Namely, first, the signal charge in the photoelectric conversion region 14 is reset by setting the potential of the photoelectric conversion region 14 to the power supply voltage VDD through application of a high pulse ØR to the reset gate 17. Next, a low pulse ØR is applied to the reset gate 17 to prevent blooming.

During storage of the signal charges, when electron-hole pairs are generated in the region below the photoelectric conversion region 14 by incident beams whose incident position is defined, electrons are stored in a depletion layer below the photoelectric conversion region 14, and holes are discharged through the P type well 12. Since a potential barrier B due to a control MOSFET between the depletion layer formed in the P type well 12 below the photoelectric conversion region 14 and the N$^+$ type region 15 which is to be a floating diffused layer, electrons remain in the region below the photoelectric conversion region 14 during the storage of the photoelectric charges.

Following that, the potential of the photoelectric conversion region 14 varies corresponding to the number of stored electrons, the potential change is output to the drain (N$^+$ type region) 15B of the MOSFET of the horizontal selection switch through the source (N$^+$ type region) 15 of the NOSFET of the source follower amplifier by the source follower action, and the result is output from the wiring layer 19B which serves as the output terminal of the source follower amplifier. In this way, it is possible to obtain a photoelectric characteristic with excellent linearity.

Here, kTC noise due to reset is generated in the N$^+$ type region 15 to be the floating diffused layer, but it is possible to remove the noise by sampling and storing dark output prior to transfer of signal electrons, and taking the difference between the bright output.

In this case, edge portions of incident beams 25' entering from the side of the light shielding film 24 are shielded in the periphery of the photoelectric conversion region 14 by the opening part 23' of the light shielding film 24, as shown in FIGS. 2A and 2B, and the region of beam incidence on the photoelectric conversion region 14 is defined.

As shown in FIG. 1 and FIG. 2, the spacing L' between the light shielding film 24 that defines the opening part 23' and the photoelectric conversion region 14 on the P type silicon substrate 11, and the spacing L0 between the light shielding film 21 that defines the opening part 23 shown in FIG. 15 and the photoelectric conversion region 14 satisfy the relation $$L' < L0,$$

which shows that the distance over which the incident beams 25' are diffused by the diffraction effect after they are defined by the opening part 23' is reduced.

Moreover, the light shielding film 24 located below the light shielding layer 20 of the logic circuit part 106 shields beams incident on the periphery of the photoelectric conversion region 14 by means of the opening part 23' of the light shielding film 24. Since the quantity of light incident on the photoelectric conversion region 14 is proportional to the size of the opening part, it is designed that the dimension (for example, the width W0) of the opening part 23' of the light shielding film 24 is set to satisfy the relation $$W0 = W'.$$

With respect to the dimension (for example, the width W0) of the opening part 23 of the light shielding film 21 shown in FIG. 15.

As a result, it is possible to reduce the quantity of light incident on the periphery of the photoelectric conversion region 14 through the diffraction effect of light, reduce the occurrence of false signals due to photoelectric conversion of diffracted light, and enhance the S/N of the image signals.

In this case, by considering the positional relationship with the logic circuit part 106, the light shielding film 24 is provided to cover the image sensor part 101, and have a continuous light shielding state by giving an overlapping part S in the plan view in the boundary portion between the image sensor 101 and the logic circuit part 106. With this arrangement, it is possible to form the image sensor part 101 and the logic circuit part 106 on the semiconductor substrate 11 by the same process without changing the fundamental design in the logic circuit part 106. As a result, variability in the defining state for defining the region of beam incidence and the layout state of wiring layers or the like can be enhanced, the distance from the portion defining the light shielding film 24 of the beam incidence region to the photoelectric conversion region 14 can be varied effectively, and increase the choice as to the wiring layers or the like in the logic circuit part 106 to be manufactured in the same process.

Figure 13:
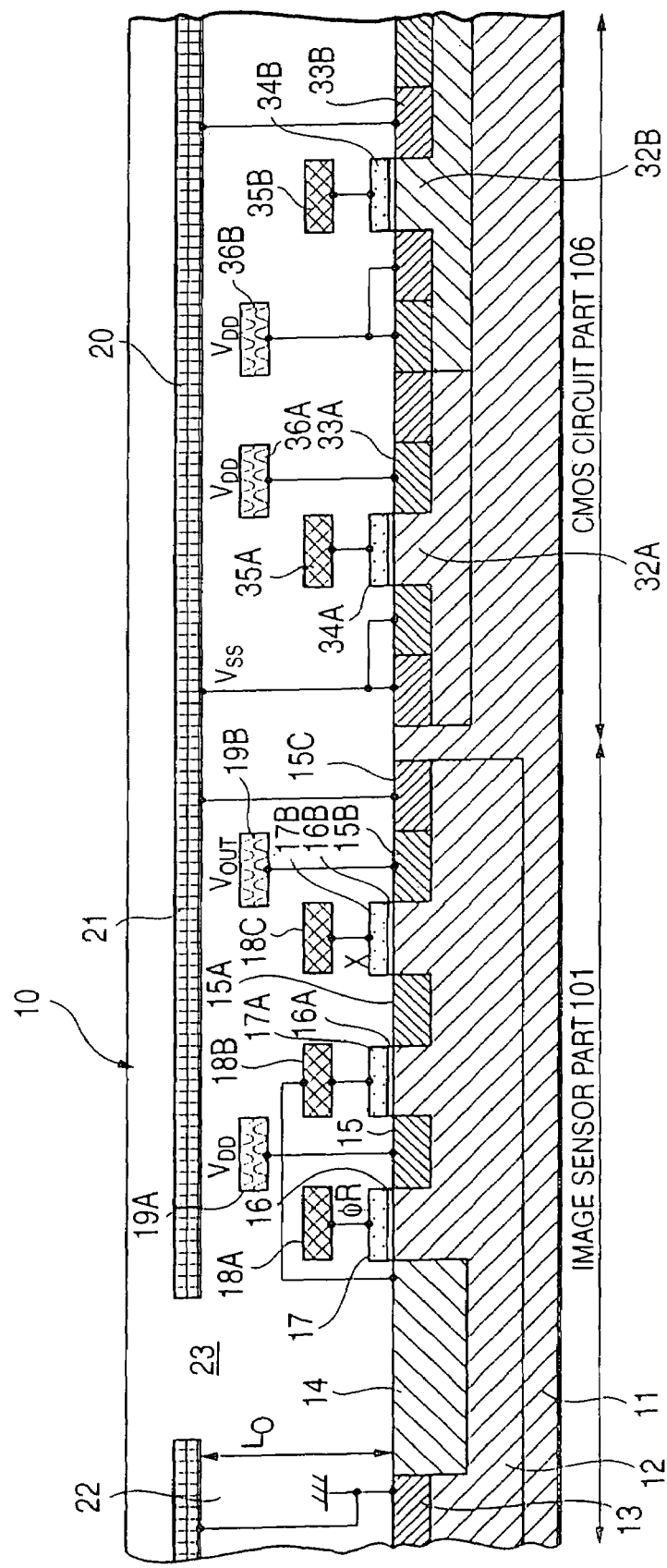
FIG. 13 is a schematic side view showing an example of the solid-state image pickup device.
Figure 14A:
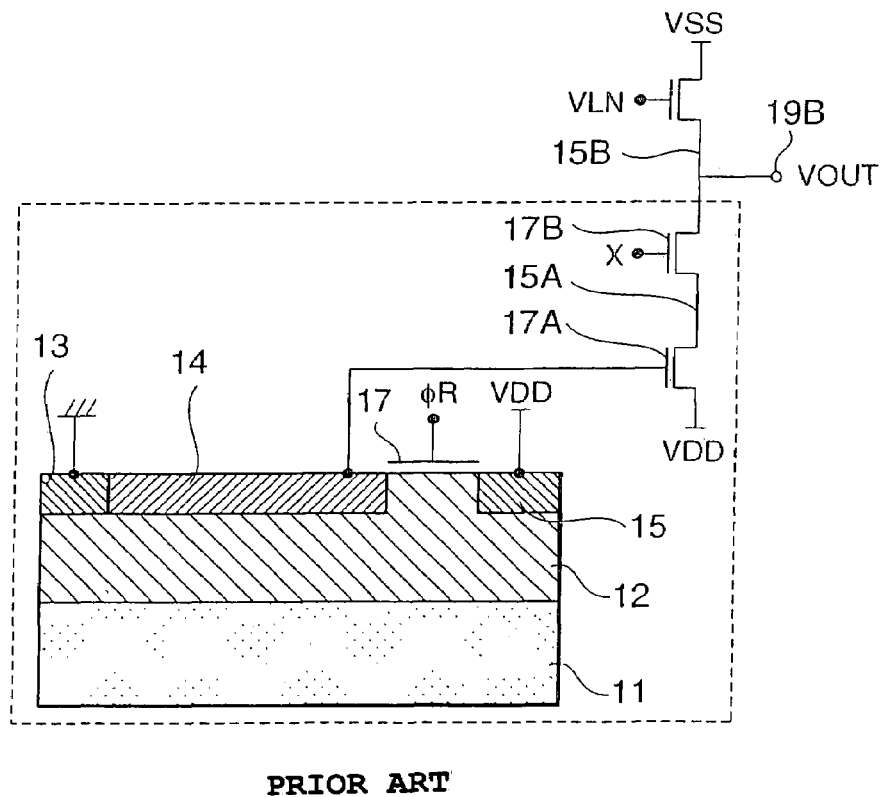
FIGS. 14A to 14C are a schematic side view showing the solid-state image pickup device and diagrams showing the potentials in the operating state.
Figure 14B:
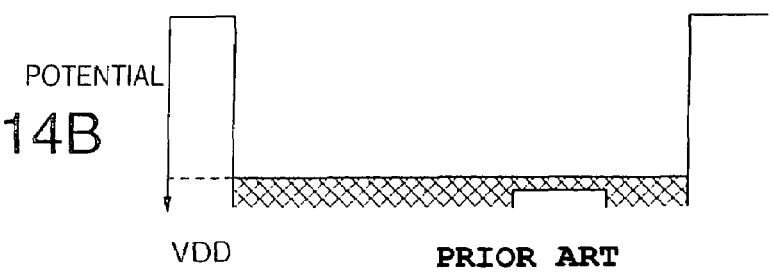
Figure 14C:
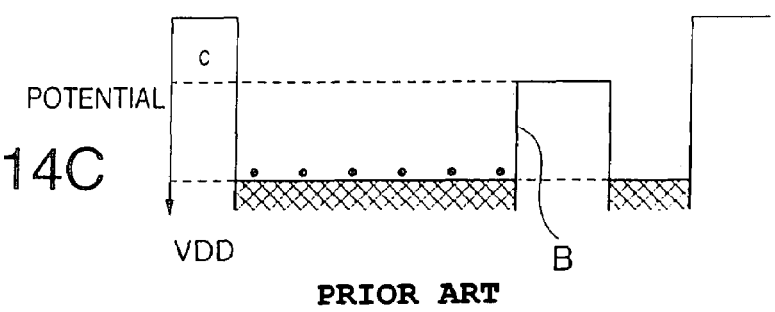

Alternatively, the light shielding film 24 may be formed below the light shielding layer 20 as shown in FIG. 2B, with an opening part 23' at a position outside the opening part 23 of the light shielding layer 21 shown in FIG. 13, and the region of beam incidence on the photoelectric conversion region 14 may be defined with the opening part 23' of the light shielding film 24, as shown in FIG. 2B. In this case, since the quantity of light incident on the photoelectric conversion region 14 is proportional to the size of the opening part, by setting the dimension (for example, the width W') of the opening part 23' of the light shielding film 24 and the dimension (for example, the width W0) of the opening part 23 of the light shielding film 21 shown in FIG. 15 satisfy the relation $$W0 \leq W',$$

it is possible to increase the quantity of light incident on the photoelectric conversion region 14 for the case of the opening part 23' of the light shielding film 24 compared with the case of the opening part 23 shown in FIG. 15, thereby preventing the deterioration in the sensitivity.

Moreover, an overlapping part S is provided in the boundary portion of the light shielding film 24 and the light shielding layer 20 as shown in FIG. 1 to make the light shielding state continuous there. In the overlapping part S, the light shielding film 24 and the light shielding layer 20 are formed to be overlapped in the plan view so as to prevent light entering the space between these layers from arriving at the semiconductor substrate 11 side. As a result, it is possible to make the light shielding state continuous in the image sensor part 101 and the logic circuit part 106 by shielding light incident on the portions other than the photoelectric conversion region 14.

Here, the gate 17B and the wiring layer 18C are positioned above and below the light shielding film 24 with different height from the semiconductor substrate 11, so it is necessary to connect them by penetrating through the light shielding film 24. Moreover, the gate 17B and the wiring layer 18C must be insulated from the light shielding film 24.

Figure 3:
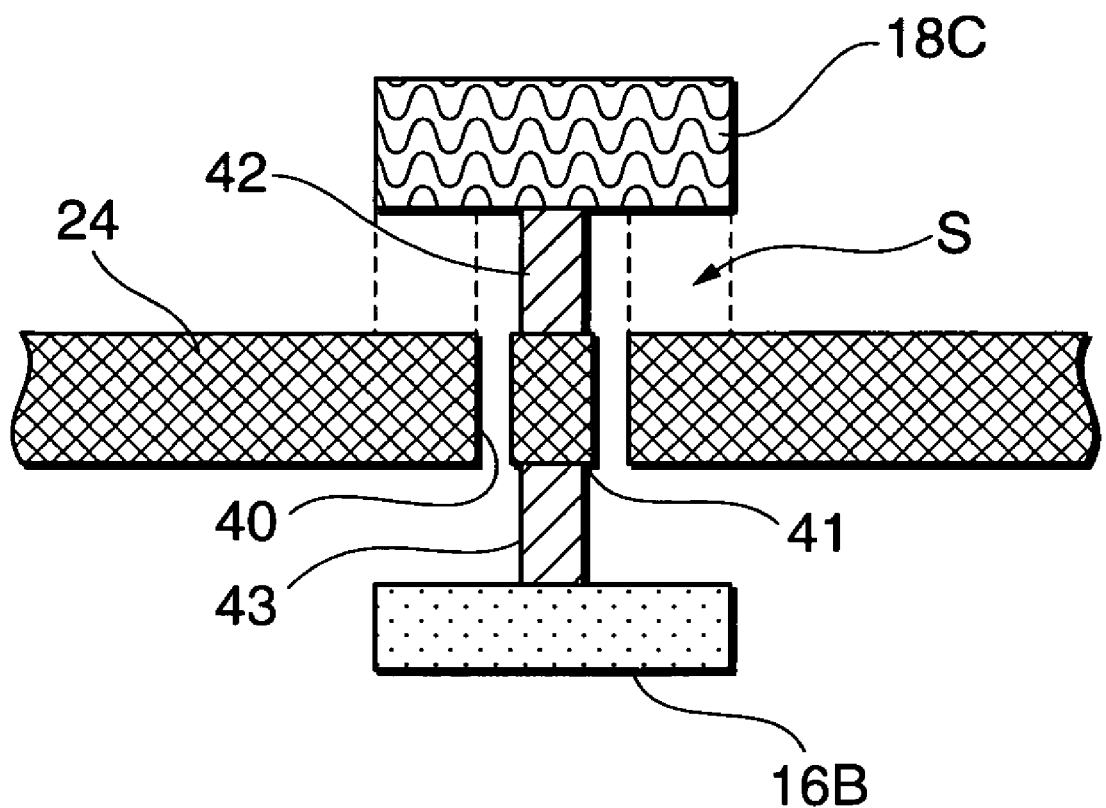
FIG. 3 is a schematic enlarged side view showing the light shielding film and its opening.
Figure 4:
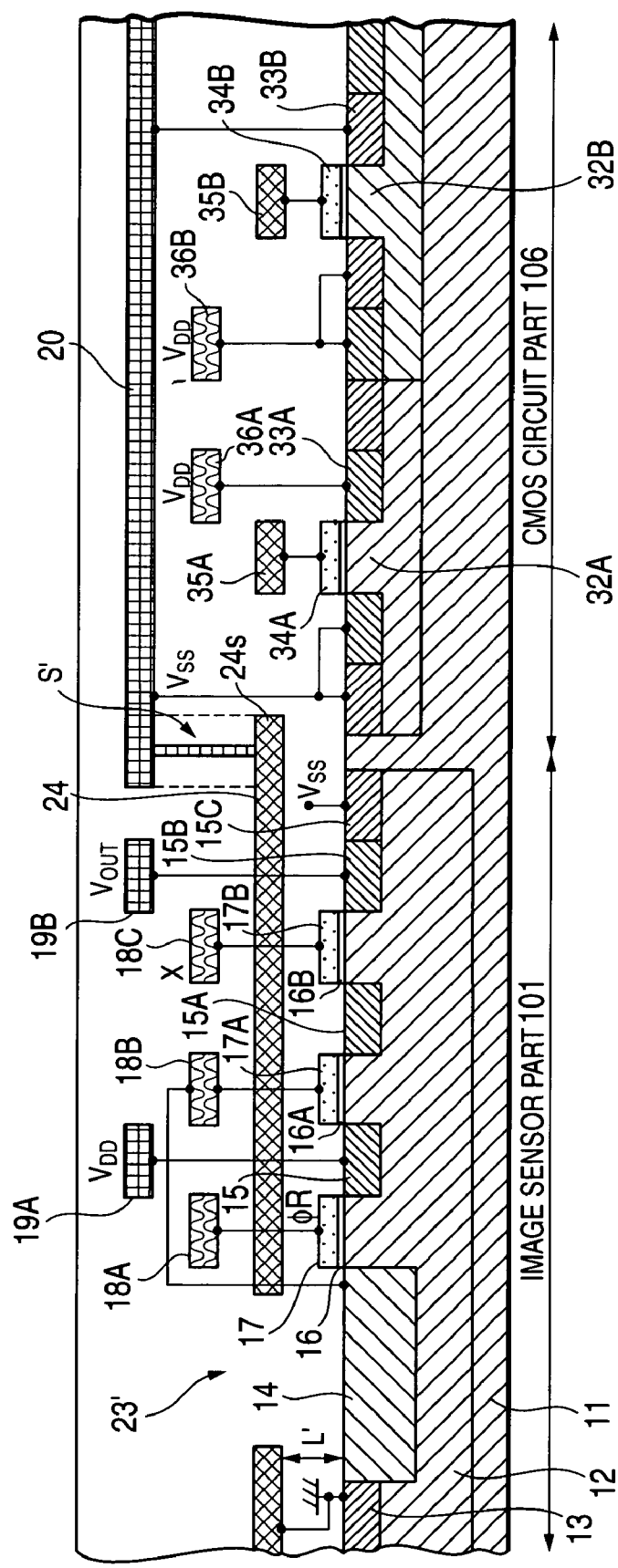
FIG. 4 is a side view showing a state in which a connection part is provided in the first embodiment of the solid-state image pickup device according to the invention.

For this reason, an opening 40 is provided in the light shielding film 24 in the connection portion between the gate 17B and the wiring layer 18C, as shown in FIG. 3, and wirings 41, 42, and 43 are provided in the vicinity of the opening 40. The wiring 41 is formed in the same process, and is placed at the same height, as the light shielding film 24, in the isolated state from the light shielding film 24. The wirings 42 and 43 are connected in the up and down direction of the wiring 41, and are connected to the gate 17B and the wiring 18C, respectively. By means of the wirings 41, 42, and 43 the gate 17B and the wiring layer 18C are connected penetrating through the opening 40.

In this case, in the wiring layer 18C and the light shielding film 24 an overlapping part S is provided in order to make the light shielding state continuous as shown in FIG. 3. In the overlapping part S, in order to prevent approach of light to the opening 40 and arrival of light at the space on the semiconductor substrate 11 side, a configuration is given in which the light shielding film 24 and the wring layer 18C have an overlapping in the plan view. In this way, it is possible to make the light shielding state continuous in the image sensing part 101 by shielding light incident on the portions other than the photoelectric conversion region 14.

Moreover, if it is necessary to provide another opening in the light shielding film 24, light incident on portions other than the photoelectric conversion region 14 is shielded by forming an overlapping part as in the wiring layer 18C, to make the light shielding state continuous.

In manufacturing the solid-state image pickup device of this embodiment, first, the P type well 12 of the image sensor part 101, and the P type well 32A and the N type well 32B of the logic circuit part 106 are formed in the P type silicon substrate 11 [P type well and N type well formation step], the gate SiO2 films 16, 16A, and 16B of the image sensor part 101 are formed on the P type well 12, and the gate SiO2 films of the logic circuit part 106 are formed on the P type well 32A and on the N type well 32B [gate SiO2 film formation step], then the reset gate 17 and gates 17A and 17B of the image sensor part 101, and the gates 34A and 34B of the logic circuit part 106 are formed on the SiO2 films 16, 16A, 16B, and the like [gate formation step], the P type regions 13 and 15C of the image sensor part 101, and the $P^+$ type region 33B of the logic circuit part 106 are formed [$P^+$ type region formation step], and the photoelectric conversion region 14, the reset drain region 15, the $N^+$ type regions 15A and 15B of the image sensor part 101, and the $N^+$ type region 33A of the logic circuit part 106 are formed [$N^+$ type region formation step].

Next, after formation of a layer insulating film as needed, a light shielding film 24 having the opening part 23' and covers the image sensor part 101, and the wiring layers 35A and 35B of the logic circuit part 106 having a prescribed pattern are formed at positions with the same height as the light shielding film 24 so as to have the height of L' from the photoelectric conversion region 14 [first metal layer formation step].

Then, after formation of a layer insulating film as needed, the wiring layers 36A and 36B of the logic circuit part 106, and the wiring layers 18A, 18B, and 18C of the image sensor part 101 are formed arranged at the same height with a prescribed pattern [second metal layer formation step].

Following that, after formation of a layer insulating film as needed, the light shielding layer 20 of the logic circuit part 106 and the wiring layers 19A and 19B of the image sensor part 101 are formed at the same height with a prescribed pattern [third metal layer formation step].

In this way, the solid-state image pickup device as shown in FIG. 1 and FIG. 2 is manufactured for the image sensor part 101 and the logic circuit part 106 by forming in the same process a plurality of layers that have the same height or that can be manufactured in the same process.

In this embodiment, a plurality of layers that are at the same height or can be formed in the same process, such as the gate SiO2 films 16, 16A, and 16B of the image sensor part 101, and the SiO2 films of the logic circuit part 106 in [gate SiO2 film formation step], the reset gate 17 and the gates 17A and 17B of the image sensor part 101, and the gates 34A and 34B of the logic circuit part 106 in [gate formation step], the light shielding film 24 of the image sensor part 101, and the wiring layers 35A and 35B of the logic circuit part 106 in [first metal layer formation step], the wiring layers 36A and 36B of the logic circuit part 106, and the wiring layers 18A, 18B, and 18C of the image sensor part 101 in [second metal layer formation step], and the light shielding layer 20 of the logic circuit part 106, and the wiring layers 19A and 19B in [third metal layer formation step], are formed in the same process.

In this way, various pieces of hardware such as a CPU, memory, standard/dedicated macro, analog circuit, and image sensor part that are integrated (H/W integration), and various pieces of software such as image compression and expansion, sound processing, and communication function that are integrated (S/W integration) may be unified on a single chip to allow an LSI single body to be manufactured as an SOC that includes desired system/element functional operations. At the same time, it is possible to form simultaneously a logic circuit part 106 and an image sensor part 101 having a CPU, memory, standard/dedicated macro, analog circuit or the like by means of CMOS processes with standard parameters that are employed widely in the manufacture of logic circuits or the like, contributing significantly to the reduction in the manufacturing cost.

Incidentally, although a configuration is described in this embodiment in which the light shielding film 24 and the light shielding layer 20 have an overlapping part S in the boundary part of the image sensor part 101 and the logic circuit part 106, it is also possible to connect the light shielding film 24 and the light shielding layer 20 in the boundary part by placing them at the same position in the plan view, that is, by providing a connection part S' in a continuous state in the beam incidence direction.

In this case, incidence of beams to the lower side of the boundary part can be prevented almost perfectly, since it is possible to connect the light shielding layer 20 and the overlapping part 24s integrally. Accordingly, it is possible to make the light shielding state continuous in the boundary part of the image sensor part 101 and the logic circuit part 106, and to reduce the width in the plan view of the overlapping part S provided for continuity of the light shielding state, namely, the width of the overlapping part 24s. This makes it possible to reduce the spacing in the arrangement of the image sensor part 101 and the logic circuit part 106 to enhance the degree of integration of the elements.

Moreover, in the boundary part of the image sensor part 101 and the logic circuit part 106, it is possible to connect the light shielding film 24 and the light shielding layer 20 without the use of the overlapping part S, namely, to connect them with either one of them in a bent state or in a corrugated state.

Figure 5:
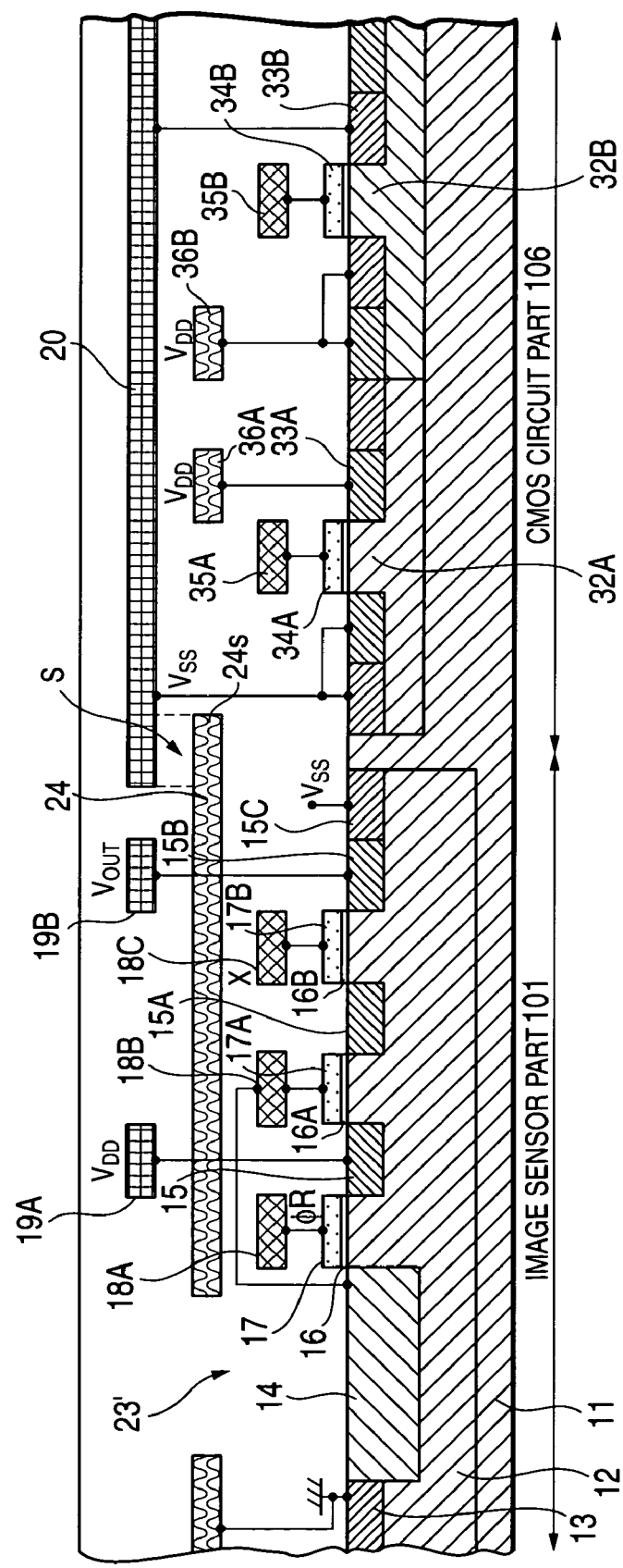
FIG. 5 is a side view showing a state in which the position of the light shielding layer is different in the first embodiment according to the invention.

Furthermore, the light shielding film 24 is formed at a position closer to the photoelectric conversion region 14 than the plurality of wiring layers 18A, 18B, 18C, 19A, 19B, and 19C so as to set the distance from the light shielding film 24 to the photoelectric conversion region 14 to be L'. However, it is possible to arrange the light shielding film 24 to be above the wiring layers 18A, 18B, and 18C and below the wiring layers 19A and 19B as shown in FIG. 5.

In this case, it is possible to form the wiring layers 18A, 18B, and 18C as a first metal layer in the same step for the wiring layers 35A and 35B to be placed at the same height, and form the light shielding film 24 as a second metal layer in the same step for the wiring layers 36A and 36B to be formed at the same height, where an effect almost the same as in the above can be realized.

Figure 6:
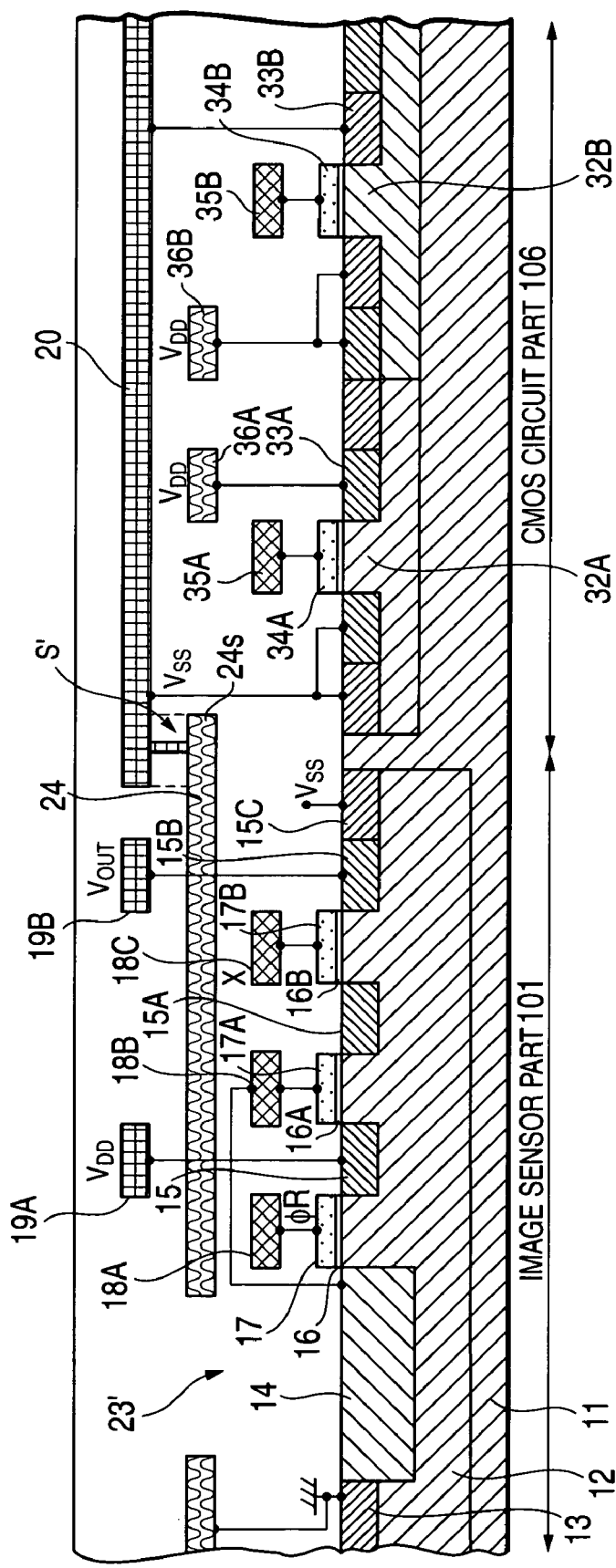
FIG. 6 is a side view showing a state in which a connection part is provided in FIG. 5.

In this case, too, it is possible to connect the light shielding film 24 and the light shielding layer 20 by placing them at the same position in plan view in the boundary part, namely, by providing the overlapping part S' in the state continuous in the direction of light incidence as shown in FIG. 6.

Since it is possible to connect the light shielding layer 20 and the overlapping part 24s by the above arrangement, it is possible to almost perfectly prevent incidence of light in the lower direction from the boundary part. Accordingly, light shielding state can be made continuous at the boundary part of the image sensor part 101 and the logic circuit part 106, and the width in the plan view of the overlapping part S provided for making the light shielding state continuous, namely, the width of the overlapping part 24s can be reduced, and the degree of integration of the elements can be realized by reducing the arrangement spacing between the image sensor part 101 and the logic circuit part 106.

Moreover, a constitution may be adopted in which the light shielding film 24 is formed integrally with one or a plurality of selected ones from among the wiring layers 18A, 18B, 18C, 19A, 19B, and 19C.

Furthermore, when it is necessary to provide an opening 40 in the light shielding film 24 as shown in FIG. 3, a configuration in light shielding may be adopted by forming an opening in one or a plurality of appropriately selected ones from among the wiring layers 18A, 18B, 18C, 19A, 19B, and 19C provided above the light shielding film 24, or from among the reset gate 17 and gates 17A and 17B provided below the light shielding film 24, and forming an overlapping part to make the light shielding state continuous.

Next, a second embodiment of the solid-state image pickup device according to this invention will be described.

Figure 7:
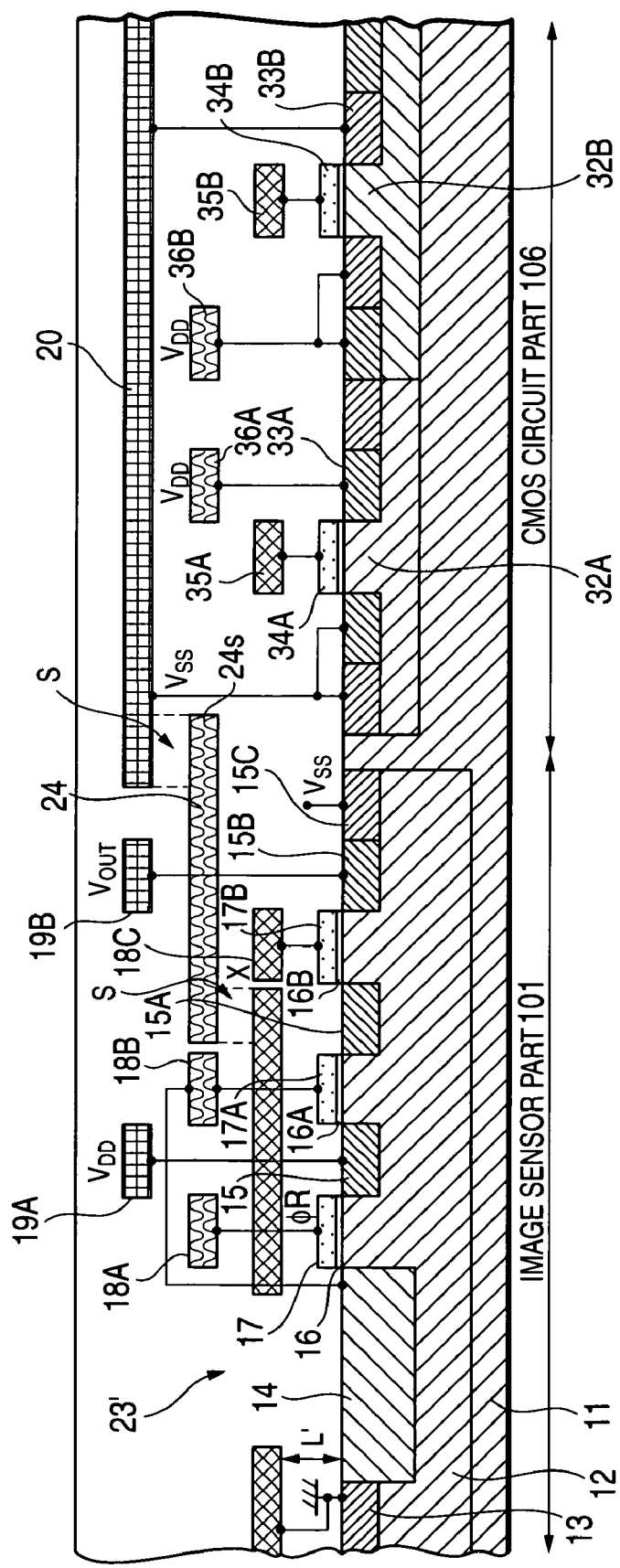
FIG. 7 is a side view showing a second embodiment of the solid-state image pickup device according to the invention.

FIG. 7 is a schematic side view showing the solid-state image pickup device of the present embodiment.

In this embodiment, the difference from the first embodiment shown in FIG. 1 and FIG. 2 consists in the point relating to the light shielding film and the wiring layers in the image sensor part, where the constituent elements approximately the same as in the first embodiment shown in FIG. 1 to FIG. 6 are given the same symbols.

In the solid-state image pickup device in this embodiment, the light shielding film 24 is provided closer to the semiconductor substrate 11 than the light shielding layer 20 as shown in FIG. 7, and it is composed of a plurality of parts 24A and 24B.

The light shielding films 24A and 24B are provided at different heights, and their boundary part of each of them is provided with an overlapping part S. The overlapping part S is given a configuration in which the light shielding films 24A and 24B are overlapped in the plan view in order to prevent light incident on the space between the films from arriving at the side of the semiconductor substrate 11. Because of this, in the boundary part of the light shielding films 24A and 24B, light incident on the portions other than the photoelectric conversion region 14 is shielded and the light shielding state in the image sensor part 101 can be made continuous.

The light shielding film 24A is provided at the same height as the wiring layers 18A and 18B of the image sensor part 101 and the wiring layers 36A and 36B of the logic circuit part 106, and has an overlapping part S in the boundary part with the light shielding layer 20. In the overlapping part S, a structure is chosen to have an overlap in the plan view between the light shielding film 24A and the light shielding layer 20 so as to prevent light incident on the space between the layers from reaching the side of the semiconductor substrate 11. As a result, in the boundary part between the light shielding film 24A and the light shielding layer 20, light incident on the portions other than the photoelectric conversion region 14 is shielded and the light shielding state in the image sensor part 101 and the logic circuit part 106 can be made continuous.

The light shielding film 24B is provided at a lower position than the light shielding film 24A, at the same height as the wiring layer 18C of the image sensor part 101 and the wiring layers 35A and 35B of the logic circuit part 106, and has an opening part 23' which defines the region of beam incidence for the photoelectric conversion region 14.

Consequently, analogous to the first embodiment, the light shielding film 24B and the wiring layer 18C of the image sensor part 101, and the wiring layers 35A and 35B can be formed as [first metal layer formation step], the wiring layers 36A and 36B of the logic circuit part 106, and the light shielding film 24A and the wiring layers 18A and 18B of the image sensor part 101 can be formed as [second metal layer formation step], in which a plurality of layers at the same height or can be formed in the same process can be formed in the identical process.

Moreover, this embodiment realizes an effect similar to the first embodiment, and has the plurality of light shielding films 24A and 25B in which the light shielding film 24A has a boundary part with the light shielding layer 20, and the light shielding film 24B provided below the film 24A defines the region of beam incidence to the photoelectric conversion region 14. In this way, in the boundary part with the light shielding layer 20, the light shielding film 24 can be provided at a position closer to the light shielding layer 20 than in the first embodiment. Moreover, in the part defining the region of beam incidence to the photoelectric conversion region 14, the light shielding film 24B can be provided at a position closer to the photoelectric conversion region 14 than in the first embodiment.

Accordingly, in the parts 24A and 24B, it is possible to reduce the distance between the light shielding film 24A and the light shielding layer 20, and the distance between the light shielding film 24B and the photoelectric conversion region 14, reducing the possibility of incidence of light to the portions other than the photoelectric conversion region 14. As a result, the false signals generated can further be reduced, and further prevent the deterioration of the S/N of the image signals by trapping the false signals in other adjacent photoelectric conversion regions or diffused layers of the output circuit or the like.

Figure 8:
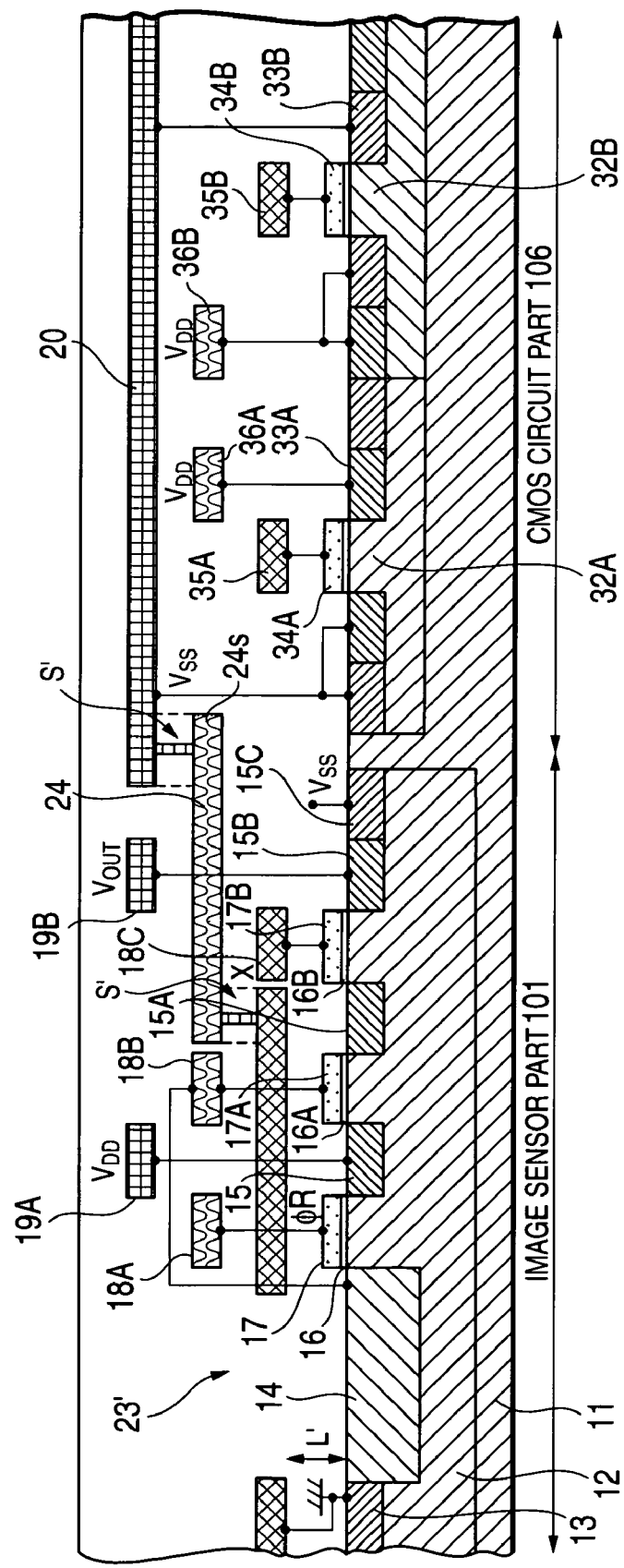
FIG. 8 is a side view showing a state in which a connection part is provided in the second embodiment of the solid-state image pickup device according to the invention.

Moreover, as shown in FIG. 8, a connection part S' may be provided in each boundary part at the same position in the plan view, namely, in the state continuous in the direction of beam incidence, to connect each of the light shielding film 24A and the light shielding film 24B, and the light shielding film 24B and the light shielding layer 20.

In this case, since the light shielding film 24A and the light shielding film 24B, or the light shielding film 24B and the light shielding layer 20 can be connected integrally, incidence of light from each boundary part to its lower section can be prevented almost perfectly. Accordingly, in the boundary part of the image sensor part 101 and the logic circuit part 106, and the boundary part between the light shielding films 24A and 24B, the light shielding state can be made continuous, and the width in the plan view of the overlapping part S for realizing continuity of the light shielding state, namely, the width of the overlapping part can be reduced. Consequently, it is possible to enhance the degree of integration of the elements by reducing the arrangement spacing between the image sensor part 101 and the logic circuit part 106. Besides, the degree of freedom in the device design can be improved by appropriately setting the position of the boundary part between the light shielding film 24A and the light shielding part 24B.

Furthermore, in the boundary part between the image sensor part 101 and the logic circuit part 106, it is possible to connect the image sensor part 101 and the logic circuit part 106 without the use of an overlapping part S, namely, by putting either one of the films in a bent state or in a corrugated state.

In the present embodiment, the light shielding film has been given a construction in which it is composed of two parts 24A and 24B, but a structure may be chosen in which it is divided into a plurality of layers of three or more, provided that it is a structure that makes the light shielding state continuous. Here, it is preferable to set the heights of a plurality of light shielding films to decrease, from the boundary part of the image sensor part 101 and the logic circuit part 106 toward the photoelectric conversion region 14. With such a construction, it is possible to set more precisely the position of incident beams to the photoelectric conversion region 14, and set the light shielding state at the boundary between the image sensor part 101 and the logic circuit part 106 more reliable.

Next, referring to the drawings, a third embodiment of the solid-state image pickup device according to this invention will be described.

Figure 9:
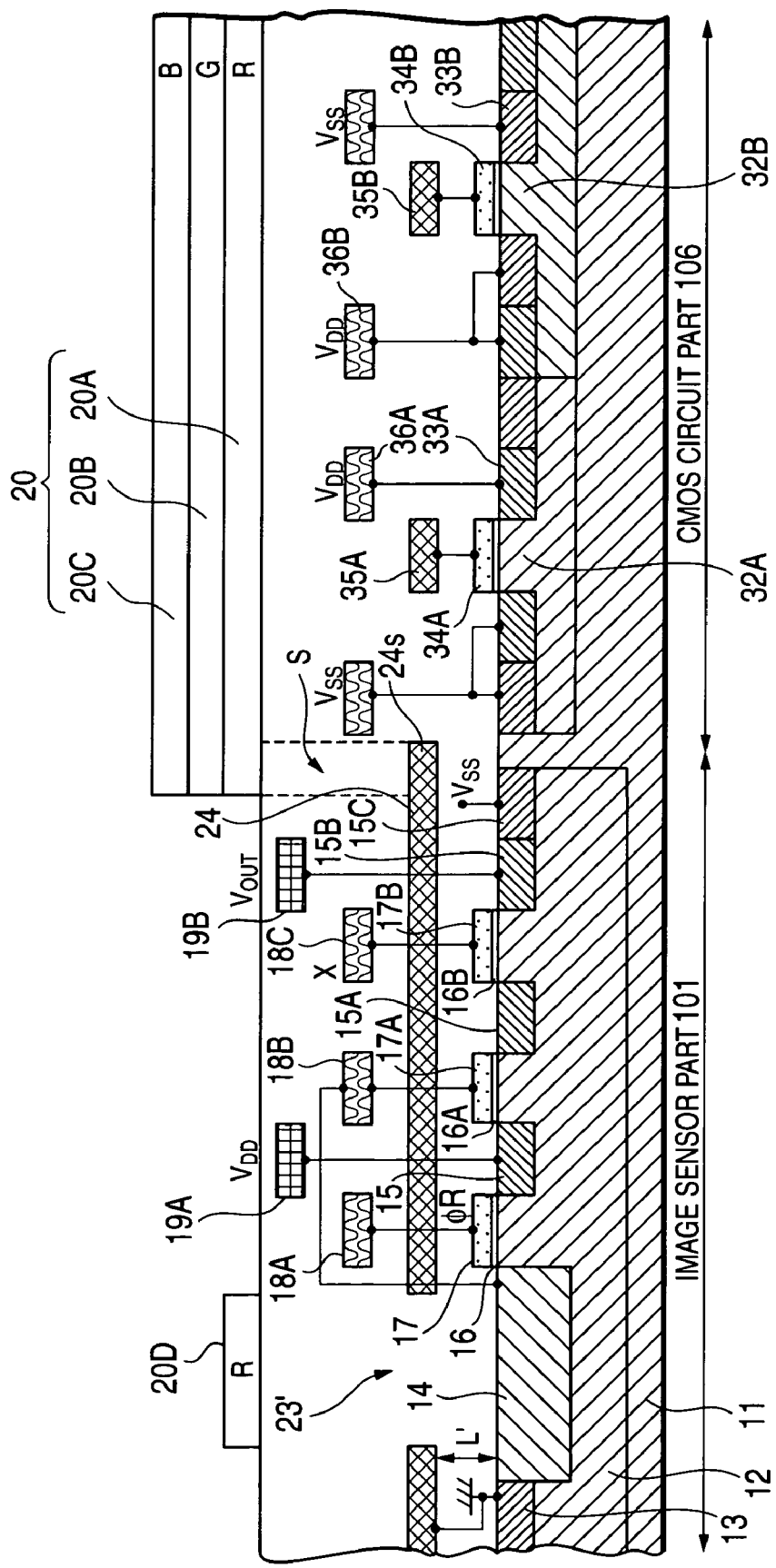
FIG. 9 is a side view showing a third embodiment of the solid-state image pickup device according to the invention.

In FIG. 9, which shows a schematic side view of the solid-state image pickup device according to the present embodiment, symbols 20A, 20B, and 20C are light shielding layers of this embodiment and 20D is a color filter.

In this embodiment, the difference from the first and second embodiments shown in FIG. 1 to FIG. 8 relates to the light shielding layer 20.

In the embodiment, the light shielding layer positioned at the topmost layer of the logic circuit part 106 consists of a plurality of layers 20A, 20B, and 20C that are laminated to cover the entirety of the logic circuit part 106, where these light shielding layers have insulating property, and have low light transparency or high light absorbency and sufficient light shielding property.

Here, it is preferable that the light shielding layers 20A, 20B, and 20C have either low light transparency or high light absorbency and hence a sufficient light shielding property, so that they may be organic materials such as gelatin and casein, and may be a material whose light transparency is reduced or the wavelength of the transmitted light is limited obtained by mixing a pigment or the like in a material having light transparency.

These light shielding layers 20A, 20B, and 20C are materials having light transparency, and can respectively be made a light shielding layer 20A which becomes a color filter corresponding to red (R) color, a light shielding layer 20B which becomes a color filter corresponding to green (G) color, and a light shielding layer 20C which becomes a color filter corresponding to blue (B) color by utilizing the dyeing process, the pigment dispersion method (photolithography).

Here, what is meant by a color filter corresponding to red (R) color transmits wavelength corresponding to red (R) color and does not transmit light with other wavelength.

The light shielding layer 20 performs light shielding of the logic circuit part 106 by laminating the light shielding layers 20A, 20B, and 20C overlapped with each other and covering the entire surface of the logic circuit part 106.

Moreover, at the boundary part of the light shielding film 24 and the light shielding layer 20 an overlapping part S is provided to make the light shielding state continuous there as shown in FIG. 9. In the overlapping part S, the light shielding film 24 and the light shielding layer 20 are overlapped in the plan view in order to prevent light entering the space between them from arriving at the side of the semiconductor substrate 11. Because of this, light incident on portions other than the photoelectric conversion region 14 is shielded in the boundary part between the light shielding film 24 and the light shielding layer 20, and the light shielding state in the image sensor part 101 and the logic circuit part 106 can be made continuous.

Here, in the image sensor part 101, by utilizing the dyeing process, the pigment dispersion method (photolithography), or the like, a color filter 20D having transparency and corresponding to three primary colors of red, green, and blue (RGB) colors is provided. In the figure, a color filter 20D corresponding to red (R) color is illustrated.

In this embodiment, it is possible to form the color filter 20D corresponding to three primary colors of red, green, and blue (RGB) colors, and the light shielding layers 20A, 20B, and 20C that are made color filters corresponding to three primary colors of red, green, and blue (RGB) colors in the same process, and cut back the manufacturing processes and the manufacturing cost.

Moreover, by providing the light shielding layer 20 having insulating property in the logic circuit part 106, it is possible to maintain the operating performance for the case of not providing a light shielding layer compared with the case of providing a conductive light shielding layer.

Furthermore, by providing the light shielding layer 20 at the topmost layer of the logic circuit part 106, and by extending it to the side of the image sensor part 101, it is possible to enhance light shielding property by enlarging the overlapping parts. At the same time, through the improvement in the degree of freedom of positional setting of the boundary part between the light shielding film 24 and the light shielding layer 20, the degree of freedom in element design can be enhanced. Besides, in the state where the quantity of light incident on the periphery of the photoelectric conversion region 14 by the diffraction effect of light, and the generation of false signals caused by photoelectric conversion of diffracted light, it is possible to enhance the degree of integration of elements by reducing the arrangement spacing between the image sensor part 101 and the logic circuit part 106.

Figure 10:
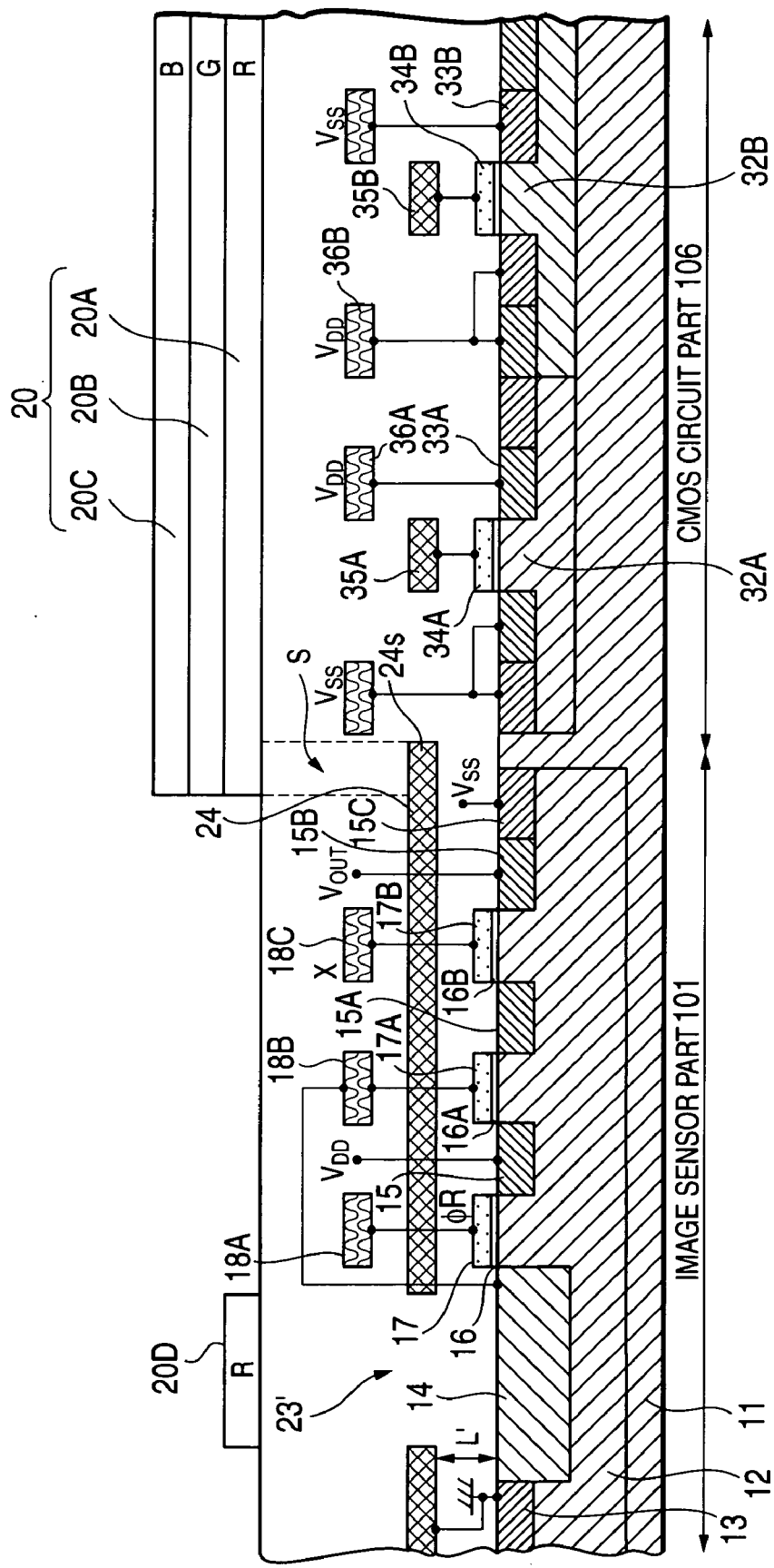
FIG. 10 is a side view showing a state in which the arrangement of the wiring layers is different in the third embodiment of the solid-state image pickup device according to the invention.

Moreover, a configuration as shown in FIG. 10 may be given to this embodiment, in which, for example, the light shielding film 24 is the first metal layer, and the wiring layers 18A, 18B, and 18C are the second metal layer for the image sensor part 101, and wiring layers 35A and 35B are the first metal layer, and the wiring layers 36A and 36B are the second metal layer in the logic circuit part 106. In other words, a configuration may be chosen in which the image sensor art 101 and the logic circuit part 106 consist only of the first and second metal layers without having a third metal layer. By forming the light shielding layer 20 without using a metal layer like in this case, it is possible to reduce the number of metal layers, the number of manufacturing steps, and the manufacturing cost, and to enhance the degree of freedom in the element design.

In this embodiment, the light shielding film may be constituted of a plurality of layers as in the second embodiment.

Next, referring to the drawings, a fourth embodiment of the solid-state image pickup device according to this invention will be described.

Figure 11:
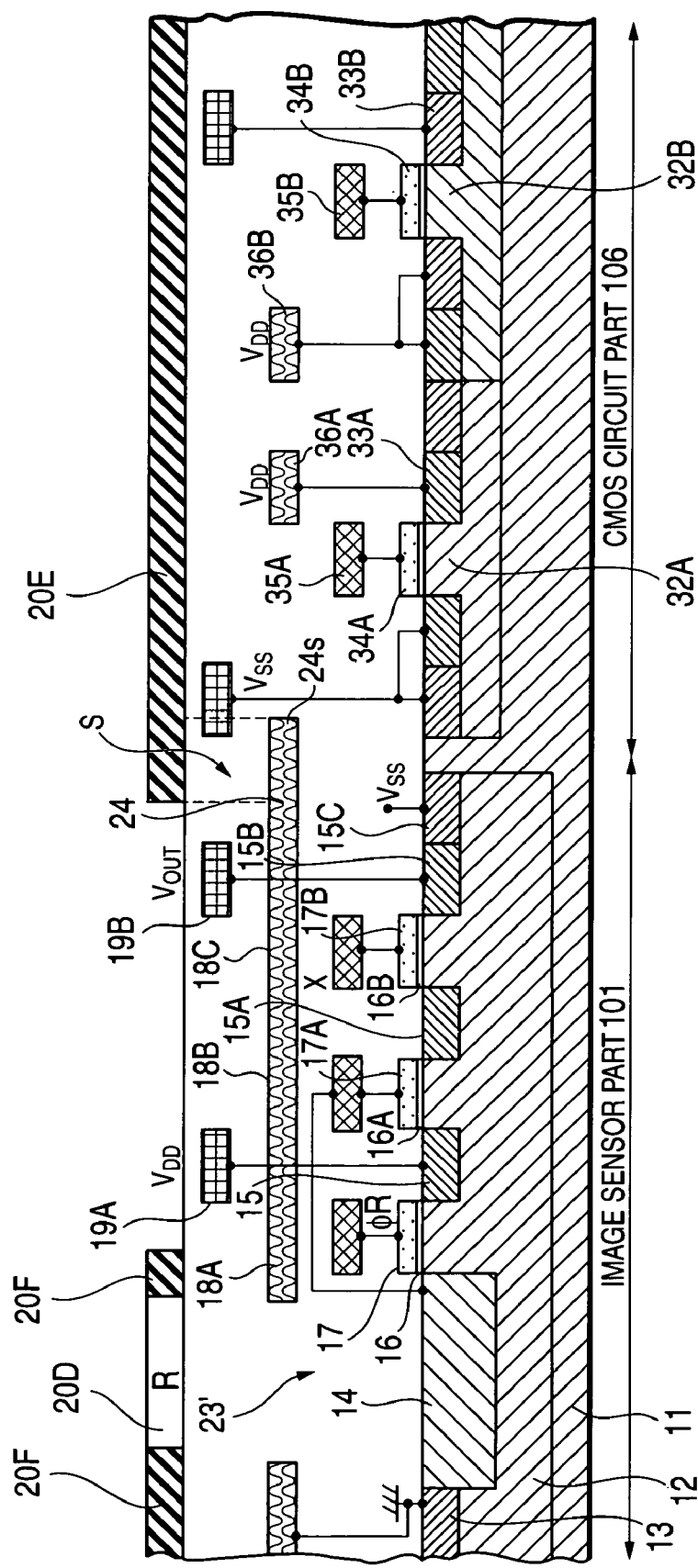
FIG. 11 is a side view showing a fourth embodiment of the solid-state image pickup device according to the invention.

In FIG. 11 showing a schematic side view of the solid-state image pickup device according to this embodiment, symbol 20E is a light shielding film of the embodiment.

In this embodiment, the difference from the third embodiment as shown in FIG. 9 and FIG. 10 is that the light shielding film 20E comprising a single layer is laminated covering the entire surface of the logic circuit part 106 as shown in FIG. 11.

It is preferable that the light shielding layer 20E has insulating property, and has sufficient light shielding property with either low light transparency or high light absorbency, and here it is chosen to be a black filter corresponding to black color with lowered light transparency obtained by mixing a pigment or the like in a material having light transparency, utilizing the dyeing process or the pigment dispersion method (photolithography).

Moreover, an overlapping part S is provided in the boundary part between the light shielding film 24 and the light shielding layer 20E as shown in FIG. 11, in order to make the light shielding state continuous there. In the overlapping part S, a structure is given in which the light shielding film 24 and the light shielding layer 20E are overlapped in the plan view in order to prevent light entering in the space between them from reaching the semiconductor substrate 11 side. As a result, in the boundary part between the light shielding film 24 and the light shielding layer 20E, light incident on the portions other than the photoelectric conversion region 14 is shielded, and the light shielding state in the image sensor part 101 and the logic circuit part 106 can be made continuous.

Here, at the position of beam incidence to the photoelectric conversion region 14 of the image sensor part 101, a color filter 20D having light transparency and Corresponding to three primary colors of red, green, and blue (RGB) obtained by utilizing the dyeing process, the pigment dispersion method (photolithography), or the like is provided.

In FIG. 11, a color filter 20D corresponding to red (R) color is illustrated.

In the periphery of the color filter 20D a black filter 20F corresponding to black color is provided to define the contour of the color filter 20D.

In this embodiment, the black filter 20F in the periphery of the color filter 20D and the light shielding layer 20E made to be a black filter corresponding to black color can be formed in the same process to reduce the manufacturing cost, realizing the same effect as in the third embodiment.

In the boundary part between the light shielding film 24 and the light shielding layer 20E, a connection part may be provided at the same position in the plan view, namely, in the state continuous in the direction of beam incidence to connect the light shielding film 24 and the light shielding layer 20E. In this case, it is possible to prevent almost perfectly the incidence of light from the boundary part to its lower side. The connection part may be formed using a metal as in the light shielding film 24, or formed using an insulator as in the light shielding layer 20E.

In each of the embodiments above, the invention has been described employing a CMOS sensor as an example, but the invention can be applied also to a CCD sensor.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A solid-state image pickup device comprising:
a multilevel wiring structure including a first group of wirings at a first level and a second group of wirings at a second level, said first level being closer to a semiconductor substrate than said second level, a photoelectric conversion part on said semiconductor substrate, said photoelectric conversion part having a photoelectric conversion region, a logic circuit part on said semiconductor substrate, said logic circuit part including a plurality of transistors to manipulate an electrical signal produced from said photoelectric conversion part and having a first wiring formed at said first level, a light shielding layer covering said logic circuit part, and a light shielding film defining a region of beam incidence on said photoelectric conversion region, wherein said light shielding film is formed at said first level and provided at a height closer to said semiconductor substrate than said light shielding layer.

2. The solid-state image pickup device as claimed in claim 1, wherein said light shielding film is located at an intermediate position between said light shielding layer and said photoelectric conversion region in the direction of beam incidence.

3. The solid-state image pickup device as claimed in claim 1, wherein said light shielding film is provided so as to cover said photoelectric conversion part as well as to make the light shielding state continuous in the boundary part between said photoelectric conversion part and said logic circuit part.

4. The solid-state image pickup device as claimed in claim 3 wherein said light shielding film and light shielding layer are connected in such a manner to make the light shielding state continuous in said boundary part.

5. The solid-state image pickup device as claimed in claim 3, wherein said light shielding film and said light shielding layer have an overlapping part that can be overlapped in the plan view so as to make the light shielding state continuous in said boundary part.

6. The solid-state image pickup device as claimed in claim 1, wherein said light shielding film covers said photoelectric conversion part by combining a plurality of layers.

7. The solid-state image pickup device as claimed in claim 1, wherein said light shielding film defines the region of beam incidence on said photoelectric conversion region by combining a plurality of layers.

8. The solid-state image pickup device as claimed in claim 6, wherein a plurality of light shielding films are provided so as to make the light shielding state continuous in their boundary parts.

9. The solid-state image pickup device as claimed in claim 8, wherein each of said plurality of light shielding films has an overlapping part that can be overlapped in the plan view so as to make a light shielding state continuous in their boundary parts.

10. The solid-state image pickup device as claimed in claim 6, wherein a plurality of light shielding films possess a portion having a boundary part with said light shielding layer and a portion that defines the region of beam incidence on said photoelectric conversion region provided at a position closer to said semiconductor substrate.

11. The solid-state image pickup device as claimed in claim 1, wherein said light shielding layer is formed of a material that has either low light transparency or high light absorbency such that its light shielding property is high.

12. The solid-state image pickup device as claimed in claim 1, wherein said light shielding film is manufactured in the same process as the manufacturing process of the logic circuit part.

13. The solid-state image pickup device according to claim 1, further comprising a second wiring provided in said photoelectric conversion part, wherein said second wiring and said light shielding layer are provided in said second level.

14. The solid-state image pickup device according to claim 1, wherein said light shielding film is made of metal.

15. The solid-state image pickup device according to claim 14, wherein said light shielding film and said first group of wirings are made of same metal.

16. A solid-state image pickup device comprising:
a multilevel wiring structure formed on a semiconductor substrate;
first and second levels of a wiring layer provided in said multilevel wiring structure, said first level being closer to said semiconductor substrate than said second level;
a photoelectric conversion part converting incident light to an electrical charge and further converting said electrical charge into an electrical signal;
a logic circuit part receiving and handling said electrical signal and having a first wiring formed at said first level,
said photoelectric conversion part and said logic circuit part being on said semiconductor substrate;
a light shielding layer covering the logic circuit part; and
a light shielding film covering said photoelectric conversion part,
wherein said light shielding film is formed at said first level and provided at a height closer to said semiconductor substrate than said light shielding layer.

17. The device as claimed in claim 16, wherein said solid-state image pickup device is a CMOS sensor.

18. The solid-state image pickup device according to claim 16, further comprising a second wiring provided in said photoelectric conversion part, wherein said second wiring and said light shielding layer are provided in said second level.

19. The solid-state image pickup device according to claim 16, wherein said light shielding film is made of metal.

20. The solid-state image pickup device according to claim 19, wherein said light shielding film and said first group of said wiring are made of same metal.

21. A solid-state image pickup device comprising:
a multilevel wiring structure on a semiconductor substrate;
first and second levels of a wiring layer provided in said multilevel wiring structure, said first level being closer to said semiconductor substrate than said second level;
an image sensor part producing an analog signal in response to light incident to said image sensor part;
a first circuit part producing a digital signal in response to said analog signal;
a second circuit part performing a signal processing operation on said digital signal,
said image sensor part and said first and second circuit parts being formed on said semiconductor substrate;
a first wiring provided in at least one of said first and second circuit parts;
a first light shielding layer covering said image sensor part; and
a second light shielding layer covering said first and second circuit parts, wherein,
said first light shielding layer is provided closer to said semiconductor substrate than said second light shielding layer, and
said first wiring and said first light shielding layer are provided in said first level.

22. The device as claimed in claim 21, wherein said image sensor part includes a photoelectric conversion region generating an electrical charge in response to said light and a transistor circuit producing said analog signal in response to said electrical charge.

23. The solid-state image pickup device according to claim 21, further comprising a second wiring provided in said image sensor part, wherein said second wiring and said light shielding layer are provided in said second level.

24. The solid-state image pickup device according to claim 21, wherein first light shielding layer is made of metal.

25. The solid-state image pickup device according to claim 24, wherein said first light shielding layer and said first wiring are made of same metal.

* * * * *